United States Patent [19]
Hosoya et al.

[11] Patent Number: 5,319,183
[45] Date of Patent: Jun. 7, 1994

[54] METHOD AND APPARATUS FOR CUTTING PATTERNS OF PRINTED WIRING BOARDS AND METHOD AND APPARATUS FOR CLEANING PRINTED WIRING BOARDS

[75] Inventors: Kimio Hosoya; Yoshihiro Teruya; Yasushi Kobayashi, all of Kawasaki, Japan

[73] Assignee: Fujitsu Limited, Kanagawa, Japan

[21] Appl. No.: 18,269

[22] Filed: Feb. 16, 1993

[30] Foreign Application Priority Data

Feb. 18, 1992 [JP] Japan ................... 4-031044
Mar. 18, 1992 [JP] Japan ................... 4-060784
Jun. 8, 1992 [JP] Japan ................... 4-147686
Aug. 21, 1992 [JP] Japan ................... 4-222873

[51] Int. Cl.$^5$ .................................. B23K 26/16
[52] U.S. Cl. ........................ 219/121.68; 134/1; 219/121.84
[58] Field of Search ............ 219/121.68, 121.69, 219/121.84; 134/1

[56] References Cited

U.S. PATENT DOCUMENTS

| | | | |
|---|---|---|---|
| 4,081,653 | 3/1978 | Koo et al. | 219/121.69 |
| 4,217,570 | 8/1980 | Holmes | 338/308 |
| 4,224,101 | 9/1980 | Tijburg et al. | 219/121.69 X |
| 4,713,518 | 12/1987 | Yamazaki et al. | 219/121.69 |
| 4,720,621 | 1/1988 | Langen | 219/121.68 |
| 4,752,668 | 6/1988 | Rosenfield et al. | 219/121.68 |
| 5,257,706 | 11/1993 | McIntyre | 219/121.69 |

Primary Examiner—C. L. Albritton
Attorney, Agent, or Firm—Armstrong, Westerman, Hattori, McLeland, & Naughton

[57] ABSTRACT

Method and apparatus for cutting a pattern of a printed wiring board and method and apparatus for cleaning a printed wiring board are provided, wherein a laser beam is irradiated onto a printed wiring board to evaporate the irradiated portion, to thereby cut a pattern or clean the printed wiring board. A laser beam is irradiated onto a cutting spot of the pattern of the printed wiring board to volatilize and remove the cutting spot, and a laser beam having a lower energy density and a larger irradiation area than that used for the pattern cutting is applied to a region of the wiring board around the cut spot, to remove molten matter adhering to that region. A suction nozzle for sweeping a surface region including the cut spot of the printed wiring board and for withdrawing molten matter adhering to the region, or a tape feeding apparatus by which an incombustible sheet or tape is disposed in close contact with the cutting spot of the pattern of the wiring board for collecting particles scattered during the pattern cutting is provided, whereby defective insulation attributable to adhesion of molten matter to the wiring board during the pattern cutting is prevented. Laser beams are applied to the printed wiring board obliquely from two directions to dry-clean the wiring board, whereby solder balls can be removed and defective pin contact is prevented without entailing an increase of the initial cost or running cost.

32 Claims, 34 Drawing Sheets

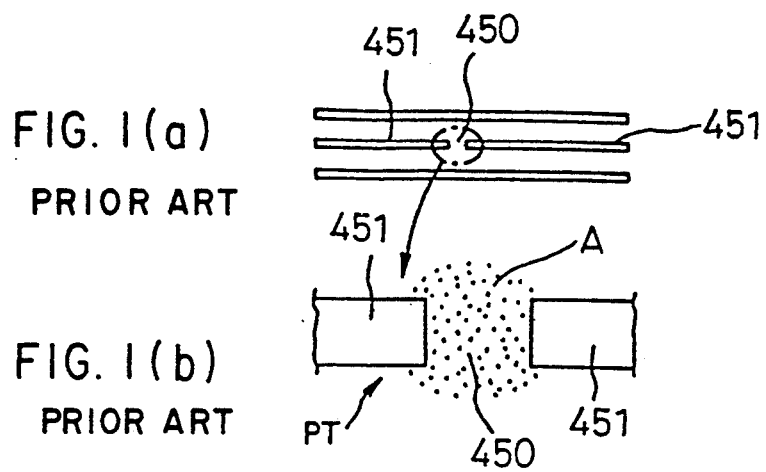
FIG. 1(a) PRIOR ART
FIG. 1(b) PRIOR ART
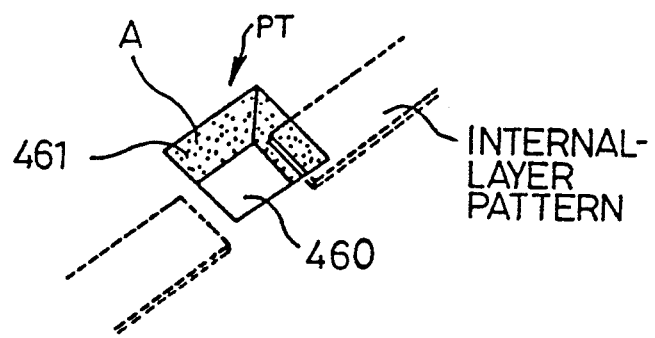
FIG. 2 PRIOR ART

PRIOR ART

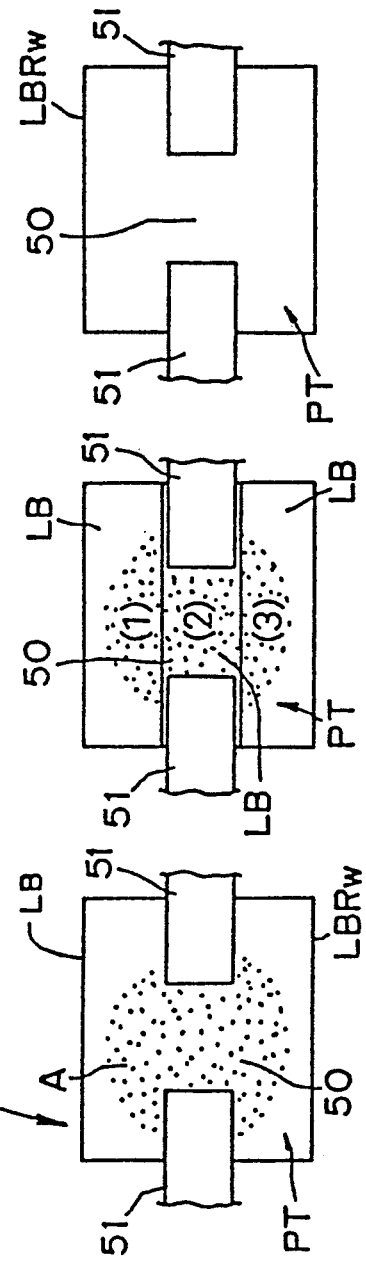

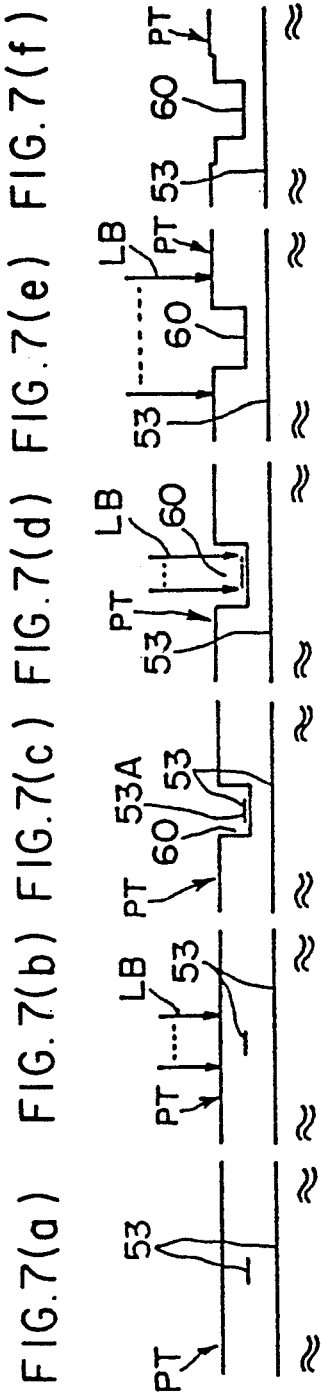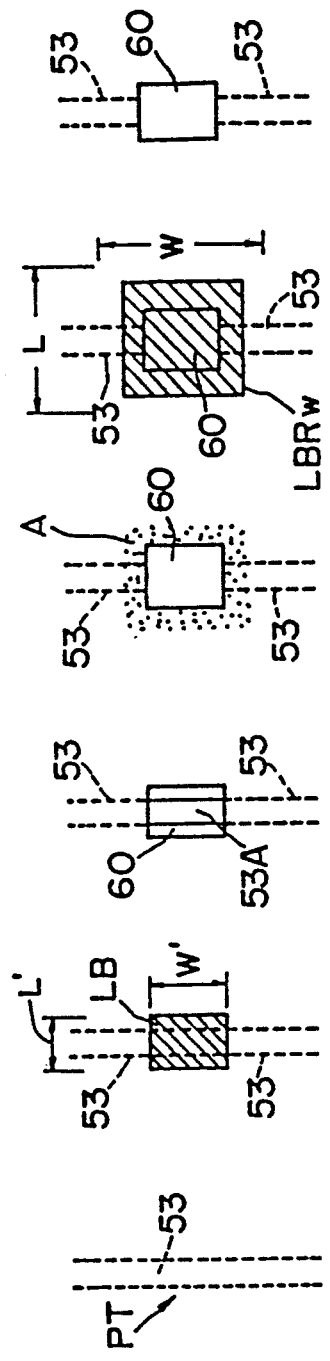

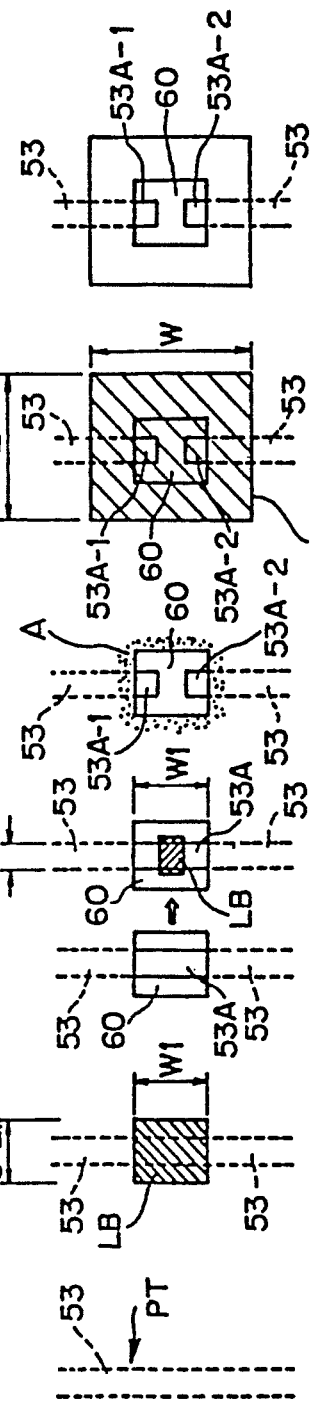

FIG. 15(a)
FIG. 15(c)
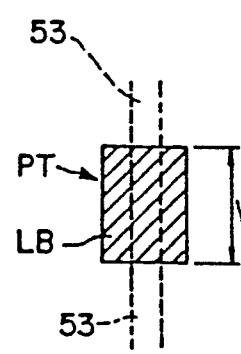
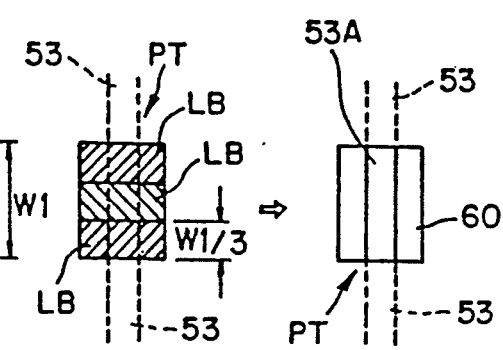
FIG. 15(b)

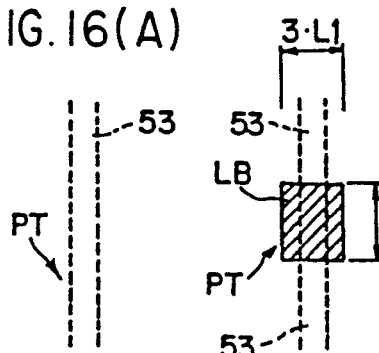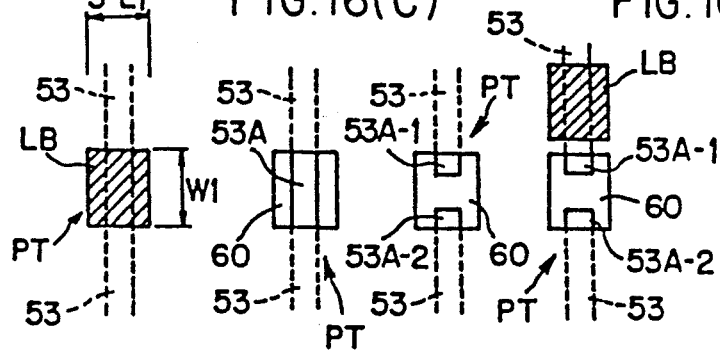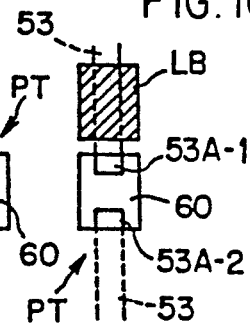
FIG.16(A) FIG.16(B) FIG.16(C) FIG.16(D) FIG.16(E)
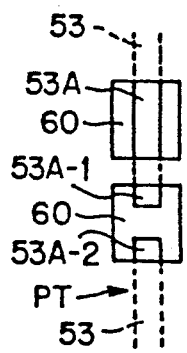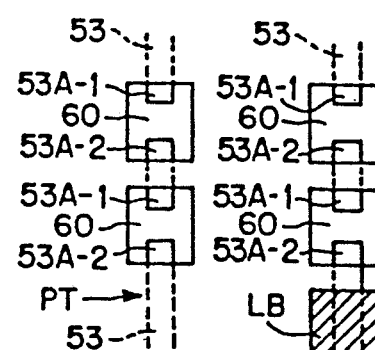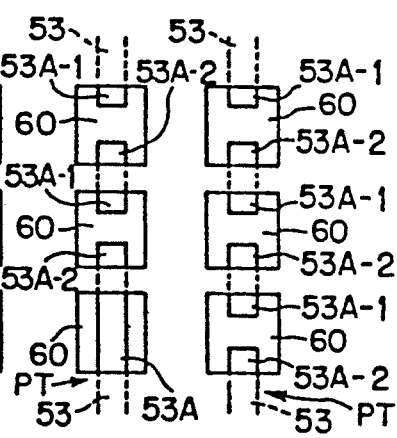
FIG.16(F) FIG.16(G) FIG.16(H) FIG.16(I) FIG.16(J)

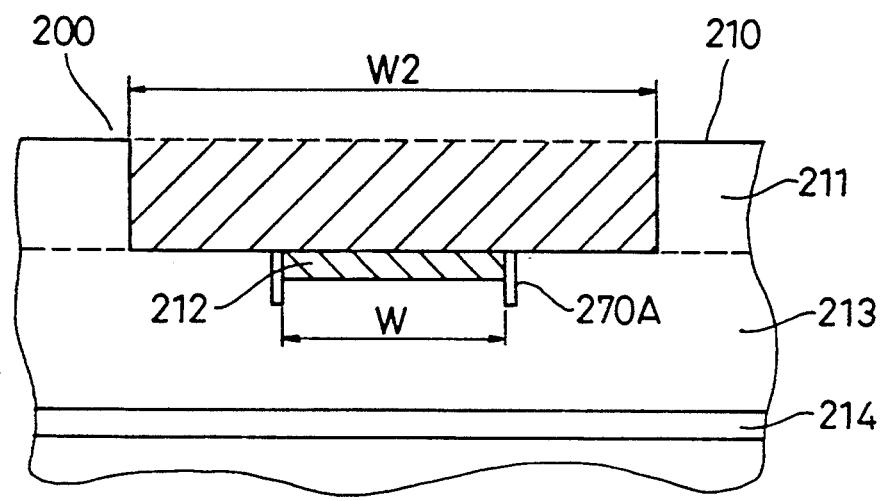
F I G. 22

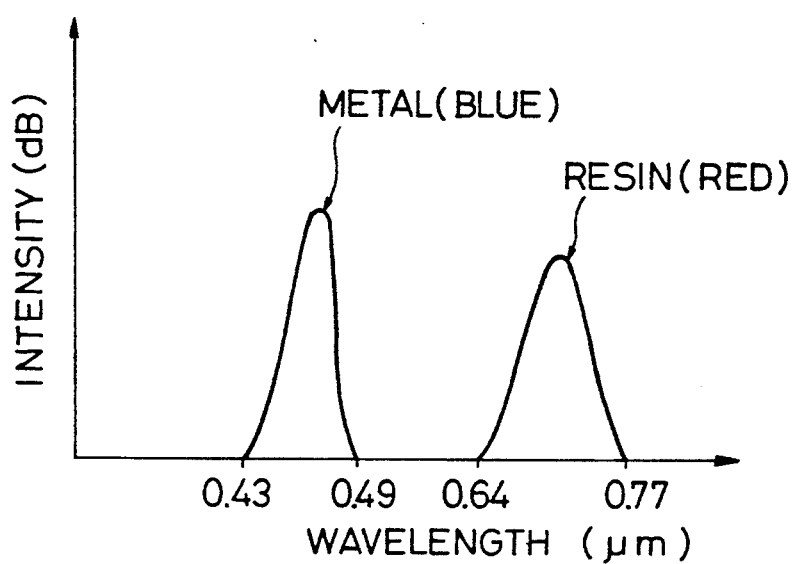
F I G. 25

METHOD AND APPARATUS FOR CUTTING PATTERNS OF PRINTED WIRING BOARDS AND METHOD AND APPARATUS FOR CLEANING PRINTED WIRING BOARDS

BACKGROUND OF THE INVENTION (1) Field of the Invention

The present invention relates to a method and an apparatus for cutting patterns of printed wiring boards and a method and an apparatus for cleaning printed wiring boards, and more particularly, to methods and apparatuses of these kinds in which a laser beam is irradiated onto a printed wiring board so that the irradiated portion is evaporated, to thereby cut a pattern or clean the printed wiring board.

(2) Description of the Related Art

With a recent trend toward high packing density of electronic devices, there has been a demand for higher mounting density of printed wiring boards constituting electronic circuits, and attempts have been made to further the miniaturization of printed wiring and the lamination of wiring layers.

In such high-density wiring printed wiring boards, when the wiring pattern design is changed, a pattern on the surface of a printed wiring board of resin or an internal-layer pattern in the printed wiring board must be partly cut. Conventionally, wiring is cut with a drill, and also a method using a laser beam for cutting patterns has been proposed.

The method using a laser beam for cutting patterns of printed wiring boards will be briefly described. Generally, a YAG laser or excimer laser capable of pulsation is used, and a beam emitted from the laser is adjusted to the same width as a pattern to be cut, and is irradiated onto the pattern to cut same. In the case of a copper pattern, for example, about 0.1-$\mu$m thickness can be removed by one pulse, and thus a copper pattern of about 50 $\mu$m thick can be cut by about 500 pulses.

Also in the case of cutting an internal-layer pattern, a laser beam is irradiated to remove the resin on the internal-layer pattern, and then cut the internal-layer pattern.

In the conventional method using a laser beam for cutting patterns of printed wiring boards, however, when a pattern 451 formed on a surface of a printed wiring board PT is cut at a cutting spot 450, as shown in FIG. 1(a), molten matter A such as copper or resin scatters, as shown in FIG. 1(b), adheres to the surface of the printed wiring board PT. The adhering matter can cause defective insulation of the cut pattern 451.

In the case of cutting an internal-layer pattern, molten matter A such as copper or resin scatters, as shown in FIG. 2, adheres to inner walls 461 of a recess 460 which is formed by the removal of resin, thus also possibly causing defective insulation of the cut pattern.

Further, the internal-layer pattern cutting is associated with the following problems:

FIG. 3 is a sectional view of a printed wiring board and illustrates a conventional method using a laser beam for cutting an internal-layer pattern. Referring to the figure, when a first internal-layer pattern 412 of a printed wiring board 400 is to be cut by removing a region 412A, a laser beam 470B is irradiated onto the region 412A in the direction indicated by arrow 401. In this case, if the pattern width is not known beforehand, conventionally the first internal-layer pattern 412 is observed through a surface layer 410, the width of the laser beam 470B is adjusted to be equal to the observed pattern width W, and the laser beam 470B is irradiated onto the surface layer 410 from above so as to reach the first internal-layer pattern 412 to cut same.

However, when the width W of the first internal-layer pattern 412 is observed through the surface layer 410, it cannot be clearly recognized because of the presence of the surface layer 410 and a first resin layer 411. Thus, when the laser beam 470B is thereafter emitted with its width adjusted based on an inaccurate observed value of the pattern width W, the width of the beam 470B actually falling upon the first internal-layer pattern 412 may be greater than the pattern width W, as illustrated.

Further, the reflectivity of the laser beam 470B with respect to a metal (e.g. copper or solder) forming the internal-layer pattern greatly differs from that with respect to a resin (e.g., glass epoxy resin or polyimide resin) forming layers sandwiching the internal-layer pattern. Accordingly, when the laser beam 470B is irradiated, damage to the resin is several times heavier than that to the metal.

Thus, if the width of the laser beam 470B is greater than the pattern width W, the extra laser beam can easily melt a second resin layer 413 below the first internal-layer pattern 412, possibly cutting a second internal-layer pattern 414 apart. When cutting an internal-layer pattern by using a laser beam, therefore, it is difficult to properly cut the target internal-layer pattern alone.

Meanwhile, chlorofluorocarbons or trichloroethane has conventionally been used for cleaning printed wiring boards. To protect the ozonosphere, however, the use of the above mentioned fluid is being prohibited, and an alternative highly effective method for cleaning printed boards is demanded.

As an alternative to the method using chlorofluorocarbons or trichloroethane for cleaning printed boards, a non-washing method and a method using a substitute solvent are conventionally used.

In the non-washing method, printed boards are cleaned with low-active flux plus $N_2$ reflow, and in the cleaning method using a substitute solvent, printed boards are cleaned with water.

These conventional methods, however, have the following drawbacks:

In the non-washing method, solder balls cannot be removed, and defective pin contact or corrosion of patterns are caused by the residual of the flux.

In the cleaning method using water as the substitute solvent, rust is likely to gather, and an equipment for treating the water used for the cleaning, a finish drying equipment and the like are required, which leads to an increase of the initial cost and the running cost.

SUMMARY OF THE INVENTION

A first object of this invention is to provide a method and an apparatus for cutting a pattern of a printed wiring board which can prevent defective insulation attributable to the adhesion of molten matter to the printed wiring board during pattern cutting.

A second object of this invention is to provide a method and an apparatus for cutting a pattern of a printed wiring board by which an internal-layer pattern can be properly cut with a laser beam.

A third object of this invention is to provide a method and an apparatus for cleaning printed wiring boards which require only low initial cost and low running cost, can remove solder balls, and which can prevent defective pin contact.

To achieve the above objects, according to this invention, there is provided a method of cutting a pattern formed for wiring on a surface of a printed wiring board by using a laser beam whose output is variable. In this method, a laser beam is irradiated onto a cutting spot of the pattern to be cut on the printed wiring board, to volatilize and remove the cutting spot, and a laser beam having a lower energy density and a larger irradiation area than that used for cutting the pattern is irradiated onto a region of the printed wiring board near the cut spot, to remove molten matter adhering to the region of the printed wiring board near the cut spot.

Further, this invention provides an apparatus for cutting a wiring pattern of a printed wiring board by irradiation a laser beam onto the wiring pattern to evaporate same. This apparatus comprises a laser apparatus for intermittently emitting a pulsed laser beam whose pulse width, pulse height, irradiation interval and number of times of irradiations are variable, the laser apparatus including a mask arranged midway in a path of the laser beam for adjusting the width of the laser beam to be identical to a width of the wiring pattern is to be cut, a carrier mechanism including an XY table carrying the printed wiring board thereon and movable to a desired position on a plane, and a control unit for numerically controlling the movement of the XY table, and a suction nozzle including a rotary flat brush and connected to an exhaust system, the rotary flat brush being rotated and moved along an axis of rotation thereof by a drive unit to sweep a surface region including a cut spot of the printed wiring board and including a vent hole.

Instead of the suction nozzle, a tape feeding apparatus may be used which includes a press roller for pressing an incombustible sheet or tape into close contact with the cutting spot of the wiring pattern of the printed wiring board, and a take-up roller for winding the sheet or tape thereon after the wiring pattern is cut by irradiation of the laser beam via the sheet or tape, such that a surface of the sheet or tape to which particles scattered during cutting of the wiring pattern adhere is wound inside.

In the method and apparatus described above, defective insulation attributable to adhesion of molten matter to the printed wiring board during the pattern cutting is prevented.

This invention further provides a method of cutting an internal-layer pattern of a printed wiring board by irradiating a laser beam whose width is adjustable, the internal-layer pattern being located below a resin layer of the printed wiring board. In this method, a laser beam is irradiated onto the resin layer on the internal-layer pattern, a first change at the laser beam-irradiated portion from resin forming the resin layer to metal forming the internal-layer pattern is detected, the irradiation of the laser beam is stopped when the first change is detected, a width of the internal-layer pattern which is exposed due to removal of the resin layer is determined, a laser beam whose width is adjusted in accordance with the determined width of the internal-layer pattern is irradiated onto the internal-layer pattern, a second change at the laser beam-irradiated portion from the metal forming the internal-layer pattern and resin forming the resin layer is detected, and the irradiation of the laser beam is stopped when the second change is detected.

This method permits the internal-layer pattern to be properly cut with a laser beam.

Furthermore, this invention provides a cleaning apparatus including actuating means for holding and moving a printed wiring board, and laser beam irradiation means for irradiating a laser beam onto the printed wiring board held by the actuating means. In this apparatus, the actuating means is operated such that a cleaning portion of the printed wiring board to be cleaned with the laser beam faces the laser beam irradiation means, and the laser beam is radiated from the laser beam irradiation means such that the cleaning portion of the printed wiring board is irradiated with laser beams obliquely from two directions, to thereby dry-clean the cleaning portion of the printed wiring board.

This apparatus can remove solder balls and eliminate defective pin contact, without entailing an increase of the initial cost or running cost.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 1 is a view illustrating a problem associated with prior art;

FIG. 2 is a view illustrating another problem associated with prior art;

FIG. 6 is a diagram illustrating a method of removing molten matter produced during surface pattern cutting;

FIG. 7 is a diagram illustrating a method of removing molten matter scattered on surface during internal-layer pattern cutting;

FIG. 14 is a diagram illustrating a method of cutting an internal-layer pattern;

FIG. 15 is a diagram illustrating a multiple removal method for molten matter produced during the internal-layer pattern cutting;

FIG. 16 is a diagram illustrating a method for plural internal-layer pattern cutting;

FIG. 22 is a diagram illustrating a procedure for cutting the first internal-layer pattern;

FIG. 25 is a chart showing wavelength ranges of combustion light;

DESCRIPTIO OF THE PREFERRED EMBODIMENTS

Embodiments of this invention will be hereinafter described with reference to the drawings.

Figure 3:
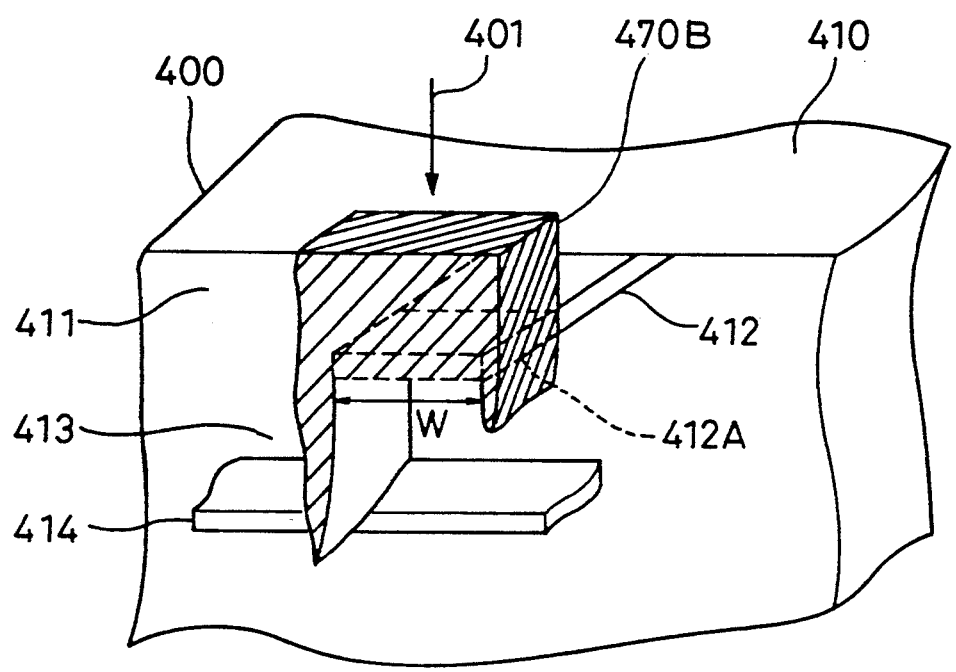
FIG. 3 is a view illustrating a conventional method of cutting an internal-layer pattern with a laser beam.
Figure 4:
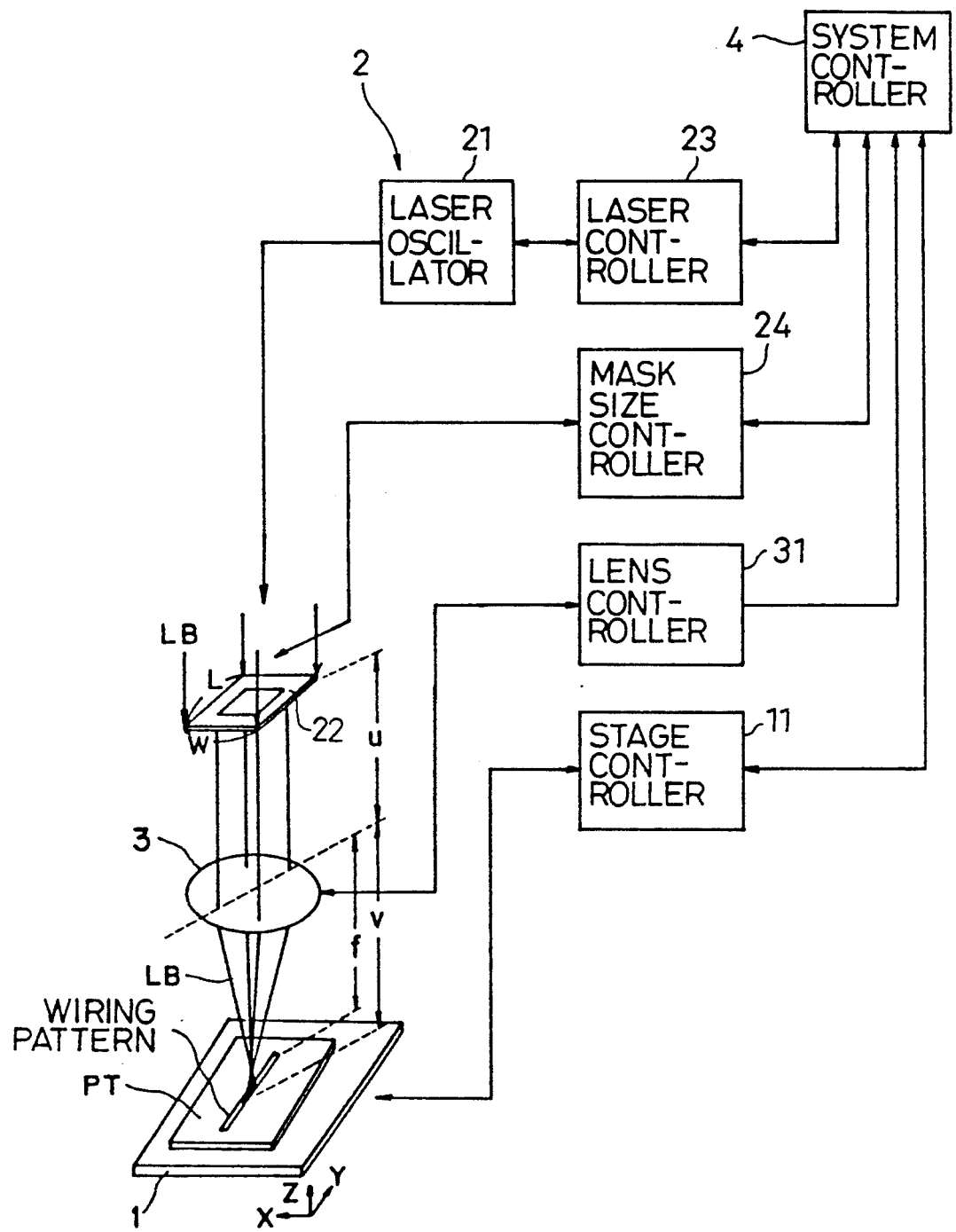
FIG. 4 is a diagram showing the entire arrangement of a first embodiment.

FIG. 4 shows the entire arrangement of a cutting apparatus for printed wiring boards according to a first embodiment of this invention. In the figure, an XY stage 1, which is a table for moving a printed wiring board, carries a printed wiring board PT thereon and moves the same in a plane (two-dimensionally). The XY stage 1 is provided also with a Z stage so that the printed wiring board PT can be moved in a Z direction (vertical direction). Thus, the position of the printed wiring board PT is adjustable three-dimensionally.

The XY stage 1 is controlled by a stage controller 11 such that the printed wiring board PT can be moved to a desired position.

A laser beam irradiation apparatus 2 emits a laser beam LB to a pattern spot to be cut on the printed wiring board PT placed on the XY stage 1. To this end, the laser beam irradiation apparatus 2 comprises a laser oscillator 21 and a laser beam masking apparatus 22, and is connected to a laser controller 23 and a mask size controller 24.

The laser oscillator 21 produces the laser beam LB, and a YAG laser or excimer laser capable of pulsation is used therefor, for example.

Figure 5A:
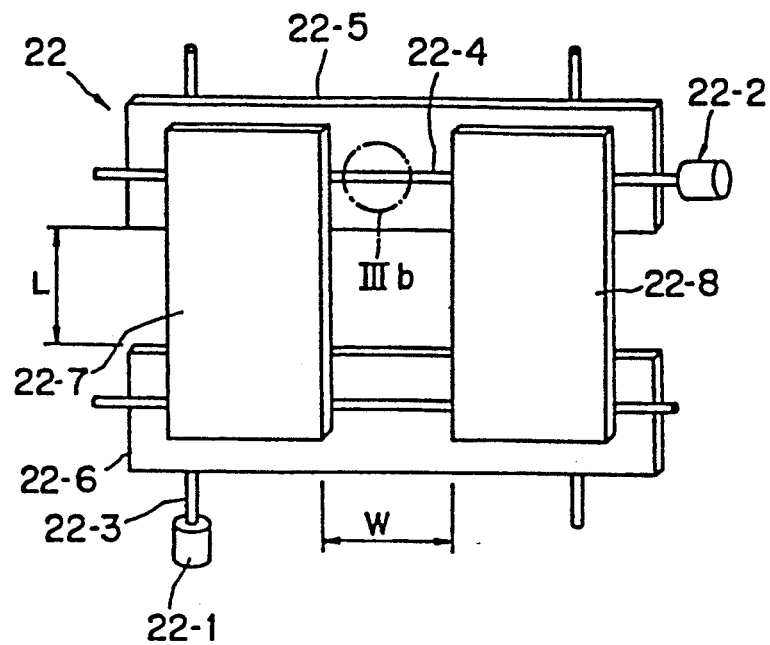
FIG. 5 illustrates a laser beam masking apparatus, in which (a) is a view schematically showing the entire arrangement of the apparatus, and (b) is an enlarged view of part IIIb in (a)

The laser beam masking apparatus 22 adjusts the range of irradiation of the laser beam LB from the laser oscillator 21, by changing opening length L and width W thereof, and comprises, e.g., two pairs of masking plates 22-5, 22-6; and 22-7, 22-8, as shown in FIG. 5(a). The paired masking plates 22-5 and 22-6 can be moved toward and away from each other as a screw 22-3 is rotated by a motor 22-1 as a drive source, to thereby adjust the mask opening length L. Also, the paired masking plates 22-7 and 22-8 can be moved toward and away from each other as a screw 22-4 is rotated by a motor 22-2 as a drive source, whereby the mask opening width W is adjusted.

Figure 5B:
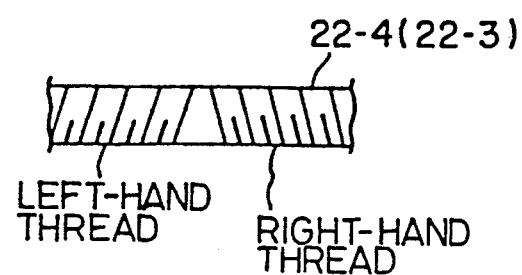

To enable the individual pairs of masking plates (22-5, 22-6; and 22-7, 22-8) to make approaching and separating motion, the screws 22-3 and 22-4 each have a right-hand thread and a left-hand thread on opposite sides thereof with the center as a boundary, as shown in FIG. 5(b).

The laser controller 23 controls the number of oscillations and the output of the laser oscillator 21. The mask size controller 24 controls the opening length L and width W of the laser beam masking apparatus 22. More specifically, the controller 24 controls the laser beam masking apparatus 22 in such a way that during a pattern cutting of the printed wiring board PT, the area of irradiation of the laser beam is narrowed, while during a removal of molten substances, the irradiation area is enlarged.

A lens system 3 serves to converge the laser beam from the laser beam masking apparatus 22, and a convex lens or the like is used therefor. The lens system 3 is vertically movable, and the vertical position thereof is controlled by a lens controller 31.

In this case, the laser beam is projected on a reduced scale under the following optical condition:

$$1/u + 1/v = 1/f \text{ (reduction ratio } m = u/v)$$

where u denotes the distance between the lens system 3 and the laser beam masking apparatus 22, v denotes the distance between the lens system 3 and the printed wiring board PT, and f denotes the focal length of the lens system 3.

The stage controller 11, the laser controller 23, the mask size controller 24, and the lens controller 31 are subjected to hierarchical control by a system controller 4.

Now, suppose a certain portion of a pattern of the printed wiring board PT must be cut because of a change of design or the like, and the following is a description of a method of cutting a desired portion by using the apparatus described above.

First, how a required portion of a wiring pattern formed on a surface of the printed wiring board PT is cut will be described.

In this case, the printed wiring board PT is set in position on the XY stage 1, and information about a pattern 51 to be cut (cutting position, cutting direction, cutting width, etc.) is input to the system controller 4, whereupon the stage controller 11 moves the XY stage 1 so that the pattern 51 to be cut comes to the laser irradiation position. Then, the mask size (L×W) is adjusted in accordance with the cutting width of the pattern.

Thereafter, a prescribed number of pulses of the laser beam LB are applied from the laser oscillator 21 to a cutting spot 50 of the pattern on the printed wiring board PT under the control of the laser controller 23, whereby the pattern 51 is partly volatilized and removed, as shown in (a) and (b) of FIG. 6.

During this pattern cutting operation for the printed wiring board PT, the mask size controller 24 controls the laser beam masking apparatus 22 such that the irradiation area of the laser beam is small, as mentioned above.

When the cutting operation is under way, molten substances A such as copper or resin scatter in the vicinity of the cutting spot, as shown in FIG. 6(b), and adhere to the surface of the printed wiring board PT. Therefore, according to this method, after the pattern 51 is partly removed, a laser beam LB having a lower energy density and a larger irradiation area is irradiated onto a region of the printed wiring board including the cut spot, to thereby remove the molten matter A adhering to a region near the cut spot. To obtain a low energy-density laser beam, the laser beam masking apparatus 22 shown in FIG. 4 is moved toward the lens system 3, to thereby reduce the reduction ratio m.

Also, the laser beam masking apparatus 22 adjusts the mask size (L×W) under the control of the mask size controller 24 such that the area of irradiation of the laser beam is enlarged. The output of the laser beam applied this time is, however, the same as that applied during the cutting operation. Thus, the laser beam, of which the energy density is reduced and the irradiation area is enlarged, is irradiated so as to cover an area indicated at LBRw in FIG. 6(b), whereby the molten matter A adhering to a region in the vicinity of the cut spot is removed, as shown in FIG. 6(d).

Alternatively, the irradiation area of the laser beam may be enlarged by raising the lens position of the lens system 3 or by moving the XY stage 1 in the Z direction (vertical direction). In this case, the lens controller 31 controls the lens system 3 such that the irradiation area of the laser beam is reduced during the pattern cutting and is enlarged during the removal of molten substances, or the table controller 11 controls the vertical position of the XY table 1 such that the irradiation area of the laser beam is reduced during the pattern cutting and is enlarged during the removal of molten matter.

In the case where the region over which the molten substances A scatter is large, the scattered region of the printed wiring board may be divided into a plurality of portions including the cut spot 50. Then, the enlarged, low energy-density laser beam LB mentioned above is irradiated onto each of the divided portions, as indicated by (1), (2) and (3) in FIG. 6(c), to remove the scattered matter A adhering to the region near the cut spot 50.

Thus, the molten matter A scattered during the pattern cutting is removed by the laser beam LB after completion of the pattern cutting, whereby defective insulation of the cut pattern can be prevented.

In the case of a printed wiring board PT which includes an internal-layer wiring pattern covered with resin (glass epoxy resin), a required portion of the internal-layer pattern (e.g., an internal-layer power plane) is cut in the following manner:

Also in this case, the printed wiring board PT is set in position on the XY stage 1, and information about the pattern to be cut (cutting position, cutting direction, cutting width, etc.) is input, whereupon the stage controller 11 actuates the XY stage 1 so that a portion of the internal-layer pattern to be cut is located at the laser irradiation position. A method of detecting the width of the cutting portion of the internal-layer pattern will be described in detail later with reference to FIGS. 19 to 27.

Subsequently, the mask size (L×W) is adjusted in accordance with the cutting width of the pattern. This state, or an initial state, of the printed wiring board PT is illustrated in (a) and (A) of FIG. 7. In the figure, reference numeral 53 denotes an internal-layer power plane.

Then, a prescribed number of pulses of the laser beam LB are radiated from the laser oscillator 21 and applied to a region of the resin corresponding in position to the cutting spot of the internal-layer pattern of the printed wiring board PT, under the control of the laser controller 23 ((b) and (B) of FIG. 7). As a result, that portion of the resin corresponding in position to the cutting spot of the internal-layer pattern is volatilized and removed, as shown in (c) and (C) of FIG. 7. Thus, a recess 60 is formed and a spot 53A of the internal-layer pattern to be cut is exposed at the bottom of the recess 60.

The laser beam LB is further irradiated onto the cutting spot 53A of the internal-layer pattern, to volatilize and remove the pattern at the spot 53A, as shown in (d) and (D) of FIG. 7.

In this case, namely, during the pattern cutting of the printed wiring board PT, the laser beam masking apparatus 22 is controlled by the mask size controller 24 such that the irradiation area of the laser beam is reduced.

When the cutting operation is under way, molten substances A such as copper or resin scatter and adhere to a surface region of the printed wiring board PT around the cutting spot, as shown in (d) and (D) of FIG. 7. In this method, after the pattern is partly removed, a laser beam LB having a lower energy density and a larger irradiation area than that used for the cutting is irradiated onto the scattered region including the cut spot of the printed wiring board, to remove the scattered matter A adhering to that region.

More specifically, the reduction ratio m is reduced by moving the laser beam masking apparatus 22 toward the lens system 3, and at the same time the laser beam masking apparatus 22 adjusts the mask size (L×W) under the control of the mask size controller 24 such that the area of irradiation of the laser beam is enlarged. The output of the laser beam applied this time is, however, the same as that applied during the cutting operation. Thus, the laser beam, of which the energy density is reduced and the irradiation area is enlarged, is intermittently irradiated onto an area indicated at LBRw in FIG. 7(e), whereby the molten matter A adhering to a region in the vicinity of the cut spot is removed, as shown in (f) and (F) of FIG. 7.

Also in this case, the irradiation area of the laser beam may be enlarged by raising the lens position of the lens system 3 or by moving the XY stage 1 in the Z direction (vertical direction).

In the case where the region over which the molten substances A scatter is large, the scattered region of the printed wiring board around the recess 60 may be divided into a plurality of portions, as in the aforementioned case. Then, the enlarged, low energy-density laser beam is irradiated onto each of the divided portions, to remove the scattered matter A adhering to the region around the cut spot.

As in the aforesaid case, the molten matter A scattered during the pattern cutting is removed by the laser beam after completion of the cutting operation, whereby defective insulation of the cut pattern is prevented.

Figures 8A, 8B, 8C:
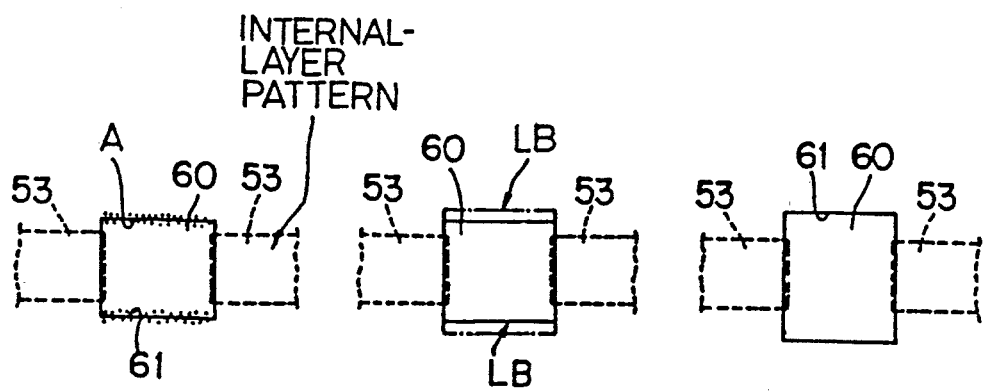
FIG. 8 is a diagram illustrating a method of removing molten matter scattered on walls during the internal-layer pattern cutting.
Figures 9A, 9B, 9C:
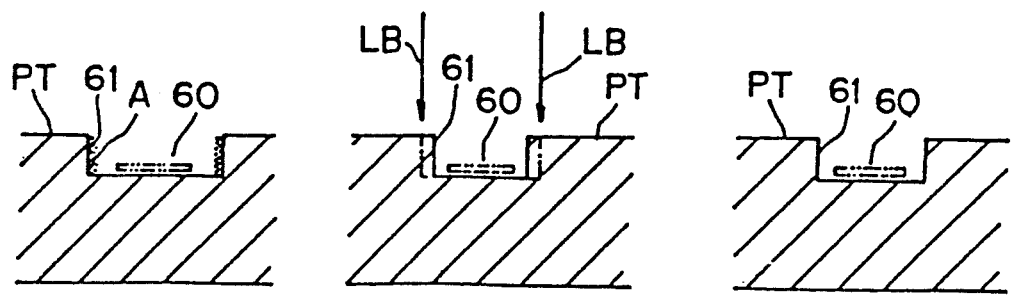
FIG. 9 is a diagram illustrating a method of removing molten matter scattered on walls during the internal-layer pattern cutting.

When an internal-layer pattern covered with resin is cut as in the above example, the scattered matter A such as copper or resin adheres also to the walls of the recess 60 made by removing the resin, and must be removed. In the method of this invention, the scattered matter A adhering to the walls of the recess 60 is removed in the following manner:

As shown in (a) to (c) of FIGS. 8 and 9, the laser beam LB, of which the irradiation area is reduced, is irradiated substantially vertically onto the walls 61 of the recess 60 made by removing the resin. As a result, the walls 61 of the recess 60 are partly removed, thereby eliminating the molten matter A adhering to the walls 61 of the recess 60.

Alternatively, the laser beam LB whose irradiation area is enlarged may be irradiated obliquely onto the walls 61 of the recess 60 which is formed by removal of the resin, to thereby get rid of the molten matter A adhering to the walls 61 of the recess 60. In this case, the laser beam LB is applied obliquely to the walls 61 of the recess 60 by using a mirror or the like, or by inclining the printed wiring board PT.

Figure 10:
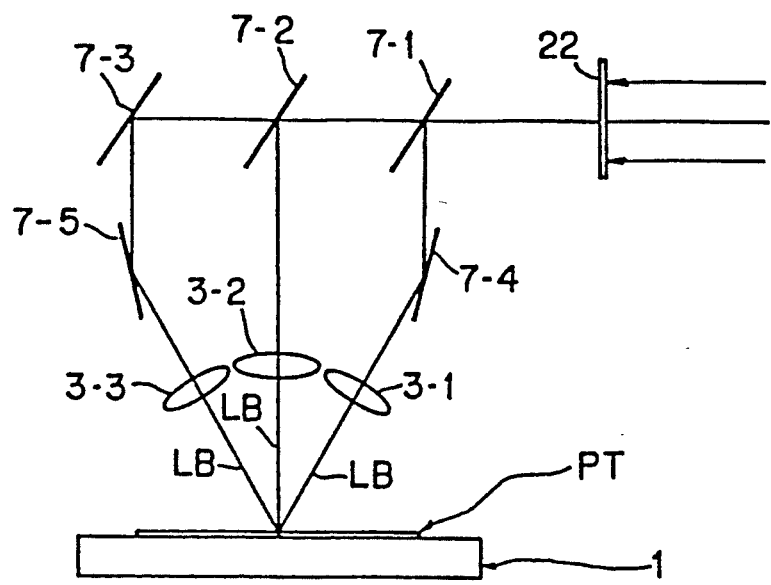
FIG. 10 is a schematic diagram of an apparatus for emitting a beam obliquely during the internal-layer pattern cutting.
Figure 11A:
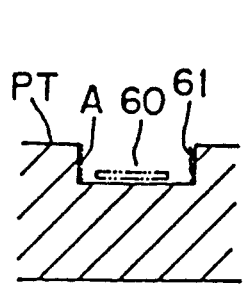
FIG. 11 is a diagram illustrating a method of removing molten matter on walls by obliquely emitting a beam from the apparatus shown in FIG. 10.
Figure 11B:
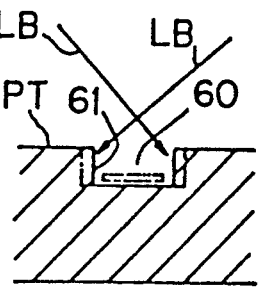
Figure 11C:
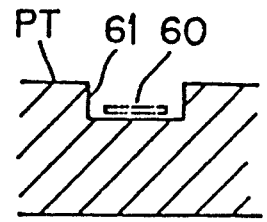

More specifically, as shown in FIG. 10, half-mirrors 7-1 and 7-2 and mirrors 7-3 to 7-5 are arranged at the output side of the laser beam masking apparatus 22, and the lens system 3 is constituted by lenses 3-1 to 3-3 for converging the respective three light beams. Thus, during the pattern cutting, the orientation of the individual mirrors is adjusted such that the laser beam LB is irradiated onto the printed wiring board PT through the middle lens 3-2. When the molten matter A adhering to the walls 61 of the recess 60 is to be removed, the orientation of the individual mirrors is adjusted such that the laser beams LB are applied directly to the respective walls 61 of the recess 60 through the outside lenses 3-1 and 3-2. This removing process is schematically illustrated in (a) to (c) of FIG. 11. Specifically, FIG. 11(a) shows a state in which the pattern cutting is completed but the molten matter A is not yet removed, FIG. 11(b) shows a state in which the molten matter A adhering to the walls 61 of the recess 60 is being removed by the laser beams LB irradiated obliquely onto the walls 61, and FIG. 11(c) shows a state in which the molten matter A adhering to the walls 61 of the recess 60 has been removed.

Now, how the printed wiring board PT is inclined to apply the laser beam LB directly to the walls 61 of the recess 60 will be described.

Figure 12:
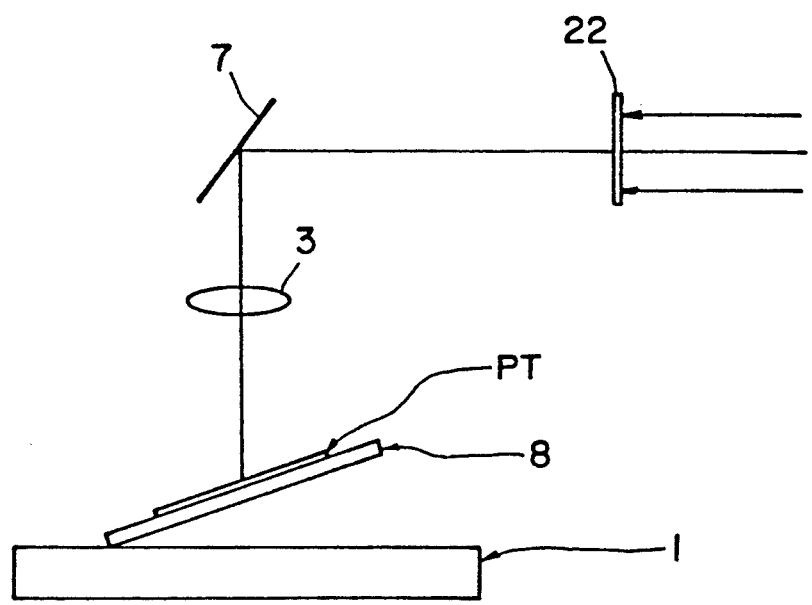
FIG. 12 is a schematic diagram of another apparatus for carrying out the oblique beam irradiation during the internal-layer pattern cutting.
Figure 13A:
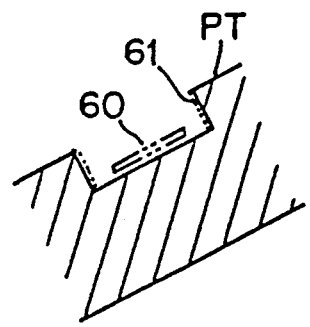
FIG. 13 is a diagram illustrating a method of removing molten matter on walls by obliquely emitting a beam from the apparatus shown in FIG. 12.
Figure 13B:
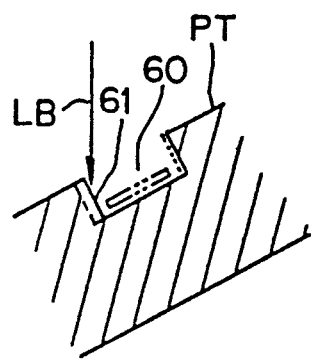
Figure 13C:
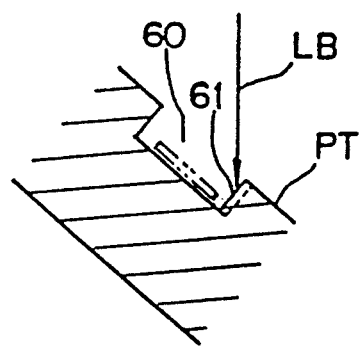
Figure 13D:
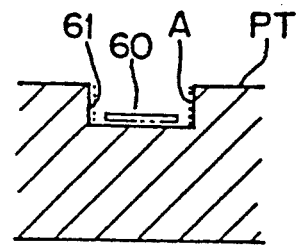

In this case, a jig 8 for tilting the printed wiring board PT is provided on the XY stage 1, as shown in FIG. 12. During the pattern cutting, the jig 8 is positioned horizontally such that the laser beam LB is irradiated onto the printed wiring board PT. When removing the molten matter A adhering to the walls 61 of the recess 60, the jig 8 is tilted such that the laser beam LB falls directly upon the wall 61 of the recess 60. In FIG. 12, reference numeral 7 denotes a mirror system for deflecting the laser beam. This removing process is schematically illustrated in (a) to (d) of FIG. 13. Specifically, FIG. 13(a) shows a state in which the pattern cutting is completed but the molten matter A is not yet removed, (b) and (c) of FIG. 13 each show a state in which the molten matter A adhering to the wall 61 of the recess 60 is being removed by the laser beam LB irradiated obliquely to the wall 61, and FIG. 13(d) shows a state in which the molten matter A adhering to the walls 61 of the recess 60 has been removed.

Thus, when an internal-layer pattern covered with resin is cut, molten matter A scatters and adheres to the walls 61 of the recess 60 formed by removing the resin, but such matter A is removed by the laser beam LB after the pattern cutting, whereby defective insulation of the cut pattern can be prevented.

In the above-described cases, there is no restriction on the order of removing operations. Namely, the operation for removing the molten matter A adhering to a region surrounding the recess 60 of the printed wiring board PT may be carried out either before or after the operation for removing the molten matter A adhering to the walls 61 of the recess 60.

Table 1 shows an example of laser conditions applied when a wiring pattern of 50 μm thick and 0.12 mm wide is to be cut for a width of 0.3 mm.

TABLE 1

| | Laser Conditions for Cutting and Cleaning | | | |
|---|---|---|---|---|
| | Beam | | Standard: $10^8 \Omega$ or more | |
| Process | irradiation area | Energy density (J/cm$^2$) | Number of pulses irradiated | Insulation resistance (after process) |
| pattern cutting | — | 10 to 20 | surface layer: about 500 pulses inner layer: about 700 pulses | $10^8 \Omega$ or less in all cases |
| method of FIG. 7(e) and 7(E) | large | 5 to 8 | 8 to 15 pulses | surface layer: $10^{10} \Omega$ or more in all cases inner layer: $10^8 \Omega$ or less with probability 1/20 |
| method of FIG. 8(b) and FIG 9(b) | small | 10 to 20 | about 200 pulses | $10^{10} \Omega$ or more in both surface and inner layers |
| method of FIG. 11(b) and FIG. 13(b)–(c) | large | 5 to 8 | about 20 to 30 pulses in each direction | $10^{10} \Omega$ or more in both surface and inner layers |

With regard to a printed wiring board including an internal-layer pattern covered with resin, another example of cutting a required spot of the internal-layer pattern will be described.

Also in this case, the printed wiring board Pt is set in position on the XY stage 1, and information on the pattern to be cut (cutting position, cutting direction, cutting width, etc.) is input, whereupon the stage controller 11 actuates the XY stage 1 so that a portion of the internal-layer pattern to be cut is located at the laser irradiation position. Then, the mask size (L × W) is adjusted in accordance with the cutting width of the pattern. This state, or the initial state, of the printed wiring board PT is illustrated in (a) or (A) of FIG. 14.

Then, a prescribed number of pulses of the laser beam LB are emitted from the laser oscillator 21 and applied to a region of the resin corresponding in position to the cutting spot of the internal-layer pattern of the printed wiring board PT, under the control of the laser controller 23 ((b) and (B) of FIG. 14. As a result, that portion of the resin corresponding in position to the cutting spot of the internal-layer pattern is volatilized and removed, as shown in (c), (C1) and (C2) of FIG. 14. Accordingly, a recess 60 is formed and a spot 53A of the internal-layer pattern to be cut is exposed at the bottom of the recess 60.

In this case, however, a larger region of the resin including the cutting spot 53A of the internal-layer pattern is removed. More specifically, assuming that the size of the cutting spot 53A of the internal-layer pattern is L1×W1, the region of the resin to be removed is set to (3×L1)×W1. Thus, a larger area of the resin is removed to ensure a larger space for the scattering of the molten substances A in the subsequent process of cutting the internal-layer pattern; therefore, the density of the molten matter A adhering to the walls 61 of the recess 60 is lessened, and the insulation quality is improved.

To remove the resin, a method shown in FIG. 15(a) in which the irradiation area is identical to the resin removing area, or a method shown in FIG. 15(b) in which the irradiation area is divided into a plurality of portions and the resin is removed for each of the divided portions may be used. When using the method shown in FIG. 15(b) in which the region of the resin to be irradiated with the laser beam LB is divided into a plurality of portions and the resin is removed for each of the divided portions, the quantity of energy applied at a time to the printed wiring board PT can be reduced (to $\frac{1}{3}$ in the illustrated example). Thus, the thermal effect on the resin is small, and carbonization is advantageously reduced. FIG. 15(c) illustrates a state in which the resin has been removed and the internal-layer pattern 53A is exposed.

Thereafter, the laser beam LB is further irradiated onto the cutting spot of the internal-layer pattern, as shown in FIG. 14(C2), to remove the pattern at that spot. In this case, however, the exposed internal-layer pattern is partly left over. Specifically, as shown in (d) and (D) of FIG. 14, a portion (53A-1, 53A-2) of the internal-layer pattern which has been cut remains exposed in the recess 60 formed by removing the resin.

Since this process is the pattern cutting of the printed wiring board PT, the mask size controller 24 controls the laser beam masking apparatus 22 such that the irradiation area of the laser beam is reduced.

Thus, when cutting the internal-layer pattern covered with resin, the internal-layer pattern is partly removed such that a portion thereof remains exposed in the recess 60, as indicated by 53A-1 and 53A-2, whereby the cut state can be easily confirmed with the eye.

When the cutting operation is under way, molten substances A such as copper or resin scatter and adhere to a surface region of the printed wiring board PT near the cutting spot, as shown in (d) and (D) of FIG. 14. Therefore, after the pattern is partly removed, a laser beam LB having a lower energy density and a larger irradiation area than that used for the cutting is irradiated onto the scattered region including the cut spot of the printed wiring board, to thereby remove the scattered matter A adhering to that region.

Namely, the reduction ratio m is reduced by moving the laser beam masking apparatus 22 toward the lens system 3, and at the same time the laser beam masking apparatus 22 adjusts the mask size (L×W) under the control of the mask size controller 24 such that the area of irradiation of the laser beam is enlarged. The output of the laser beam applied this time is, however, the same as that applied during the cutting operation. Thus, the laser beam, of which the energy density is reduced and the irradiation area is enlarged, is intermittently irradiated onto an area indicated at LBRw in (e) and (E) of FIG. 14, whereby the molten matter A adhering to the region in the vicinity of the cut spot is removed, as shown in (f) and (F) of FIG. 14.

Also in this case, the irradiation area of the laser beam may be enlarged by raising the lens position of the lens system 3 or by moving the XY stage 1 in the Z direction (vertical direction).

In the case where the region over which the molten substances A scatter is large, the scattered region of the printed wiring board including the recess 60 may be divided into a plurality of portions, as in the aforementioned case. Then, the enlarged, low energy-density laser beam LB is irradiated onto each of the divided portions, to remove the scattered matter A adhering to the region near the cut spot.

When removing the molten matter A adhering to the walls 61 of the recess 60, the laser beam may be irradiated substantially vertically onto the edge portions of the recess 60 formed by removing the resin, to partly remove the walls 61 of the recess 60 together with the molten matter A adhering to the walls 61, as mentioned above. Alternatively, the molten matter A adhering to the walls 61 of the recess 60 may be removed by irradiating the laser beam obliquely onto the walls 61 of the recess 60, or by applying the laser beam directly to the wall 61 of the recess 60 while the printed wiring board PT is inclined.

In the above-described example, a wider region of the resin is removed, and thus density of the molten matter A adhering to the walls 61 of the recess 60 and to a region around the recess 60 is reduced. Accordingly, the cleaning process shown in (e) and (E) of FIG. 14 may be omitted.

With regard to the above examples, Table 2 shows laser conditions applied when an internal-layer pattern located 0.2 mm deep from the substrate surface and having a thickness of 50 μm and a width of 0.14 mm is to be cut for a width of 2 mm.

TABLE 2

| Laser Conditions for Cutting and Cleaning | | | | |
|---|---|---|---|---|
| Laser conditions | | | | |
| energy density (J/cm²) | 25.0 | 25.0 | — | 7.0 |
| reduction ratio (M) | 14.0 | 14.0 | — | 8.0 |
| mask size (mm) | 8.4 × 6.0 | 2.8 × 2.0 | — | 16 × 16 |
| Number of pulses | 200 | 500 | — | 10 |
| Machining size (W × L mm) | 0.6 × 0.42 | 0.3 × 0.14 | — | 2.0 × 2.0 |
| Reference figure | FIG. 14 (b),(B) | FIG. 14 (c),(C1) (C2) | FIG. 14 (d),(D) | FIG. 14 (e),(E) |

With regard to a printed wiring board including an internal-layer pattern covered with resin, a still another example of cutting a required spot of the internal-layer pattern will be described.

Also in the case, the printed wiring board PT is set in position on the XY stage 1, and information on the pattern to be cut (cutting position, cutting direction, cutting width, etc.) is input, whereupon the stage controller 11 actuates the XY stage 1 so that a portion of the internal-layer pattern to be cut is located at the laser irradiation position. Then, the mask size (L×W) is adjusted in accordance with the cutting width of the pattern. This state, or the initial state, of the printed wiring board PT is illustrated in FIG. 16(A).

Then, a prescribed number of pulses of the laser beam LB are emitted from the laser oscillator 21 and applied to a region of the resin corresponding in position to the cutting spot of the internal-layer pattern of the printed wiring board PT, under the control of the laser controller 23 (FIG. 16(B)). As a result, that portion of the resin corresponding in position to the cutting spot of the internal-layer pattern is volatilized and removed, as shown in FIG. 16(C). Accordingly, a recess 60 is formed and a spot 53A of the internal-layer pattern to be cut is exposed at the bottom of the recess 60.

Thereafter, the laser beam LB is further irradiated onto the cutting spot of the internal-layer pattern, to remove the pattern at that spot. In this case, the exposed internal-layer pattern 53A is partly removed so that a portion (53A-1, 53A-2) thereof remains exposed in the recess 60 formed by removing the resin, as shown in FIG. 16(D).

Subsequently, another region of the resin which is located on the same internal-layer pattern and close to the already cut spot is volatilized and removed, and the exposed internal-layer pattern is partly volatilized and removed (see (E)-(G) of FIG. 16). A similar cutting operation is carried out for still another region of the resin located on the same internal-layer pattern and close to the cut spots (see (H)-(J) of FIG. 16). Additional cutting of the same internal-layer pattern is carried out at least once (in the illustrated example, twice).

Since this process is the pattern cutting of the printed wiring board PT, the mask size controller 24 controls the laser beam masking apparatus 22 such that the irradiation area of the laser beam is reduced.

Thus, when cutting the internal-layer pattern covered with resin, a plurality of spots of the same internal-layer pattern are removed. Accordingly, even if defective insulation occurs at one cut spot of the internal-layer pattern due to the scattered molten matter, the internal-layer pattern as a whole suffers no defective insulation.

To remove the resin, the method shown in FIG. 15(a) in which the irradiation area is identical to the resin removing area, or the method shown in FIG. 15(b) in which the irradiation area is divided into a plurality of portions and the resin is removed for each of the divided portions may be used.

Further, after the required spots of the pattern of the printing wiring board PT are removed, the molten matter-scattered regions of the printed wiring board including the cut spots may be irradiated with a laser beam having a lower energy density and a larger irradiation area than that used for the pattern cutting, to thereby remove the molten matter A adhering to the regions close to the cut spots. In this case, the laser beam with an increased irradiation area may be irradiated successively onto the three recesses 60, or may be irradiated onto the three recesses at a time. Conversely, a region including each recess 60 may be divided into a plurality of portions, and an enlarged, low energy-density laser beam LB is irradiated onto each of the divided portions to remove the molten matter A adhering to the region in the vicinity of the recess 60.

Also in this case, the irradiation area of the laser beam may be enlarged by elevating the lens position of the lens system 3 or by moving the XY stage 1 in the Z direction (vertical direction).

When removing the molten matter A adhering to the walls 61 of each recess 60, the laser beam may be irradiated substantially vertically onto the edge portions of the recess 60 formed by removing the resin, to partly remove the walls 61 of the recess 60 together with the molten matter A adhering to the walls 61, as mentioned above. Instead, the molten matter A adhering to the walls 61 of each recess 60 may be removed by irradiating the laser beam obliquely onto walls 61 of the recess 60, or by applying the laser beam directly to the wall 61 of the recess 60 while the printed wiring board PT is tilted.

As described above in detail, the pattern cutting apparatus for printed wiring boards according to the first embodiment has the following advantages:

(1) Molten substances scattered during the pattern cutting are removed by a laser beam after completion of the pattern cutting, and thus defective insulation of the cut pattern is prevented.

(2) When cutting an internal-layer pattern covered with resin, scattered matter adheres to the walls of a recess which is formed by removal of the resin. Since the scattered matter is removed by a laser beam, defective insulation of the cut internal-layer pattern is prevented.

(3) When an internal-layer pattern covered with resin is cut, a large region of the resin encompassing a cutting spot of the internal-layer pattern is removed. Thus, a large area of the resin is removed to provide a large space for the scattering of molten copper in the subsequent process of cutting the internal-layer pattern, whereby the density of the molten matter adhering to the walls of the recess is reduced and the insulation quality is improved.

(4) When cutting an internal-layer pattern covered with resin, the internal-layer pattern is partly removed such that a portion thereof is exposed in a recess formed by removing the resin, whereby the cut state can be easily confirmed with the eye.

(5) In the case of cutting an internal-layer pattern covered with resin, at least two spots of the same internal-layer pattern are removed, and thus defective insulation attributable to the scattered substances is prevented.

(6) Since a region of resin to be removed is divided into a plurality of portions, the quantity of energy applied at a time to each divided portion of the printed wiring board can be reduced, whereby the thermal effect on the resin is lessened and carbonization is reduced.

Now, another method of removing molten substances scattered on the surface of a printed wiring board, which constitutes a second embodiment of this invention, will be described.

FIG. 17 illustrates a first cutting apparatus according to the second embodiment, wherein (a) is a view showing the arrangement of the apparatus, and (b) is an enlarged perspective view of a suction nozzle section. FIG. 18 is a perspective view showing the arrangement of a tape feeding apparatus as a second cutting apparatus of the second embodiment.

In this embodiment, a 1.6 mm-thick four-layer printed wiring board made of a glass epoxy material and having a printed wiring pattern of 0.3 mm or less in width formed on a surface thereon was used.

Figure 17A:
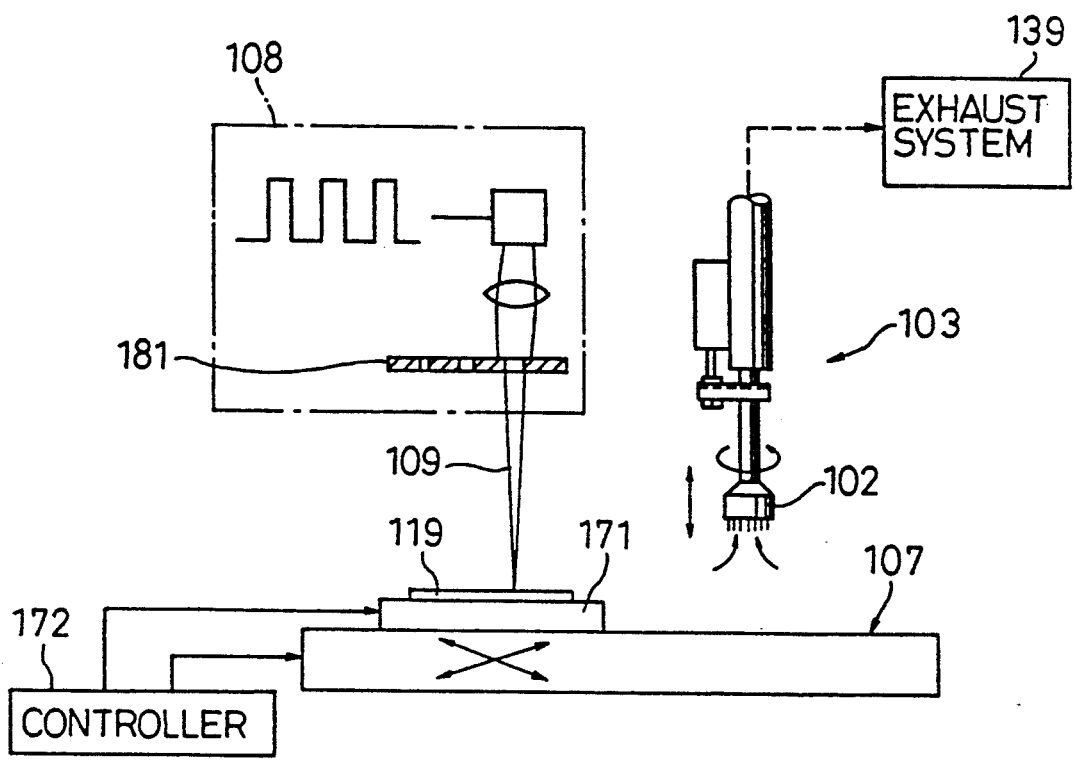
FIG. 17 illustrates a first cutting apparatus according to a second embodiment, in which (a) is a diagram showing the arrangement of the apparatus, and (b) is an enlarged perspective view of a suction nozzle section.
Figure 18:
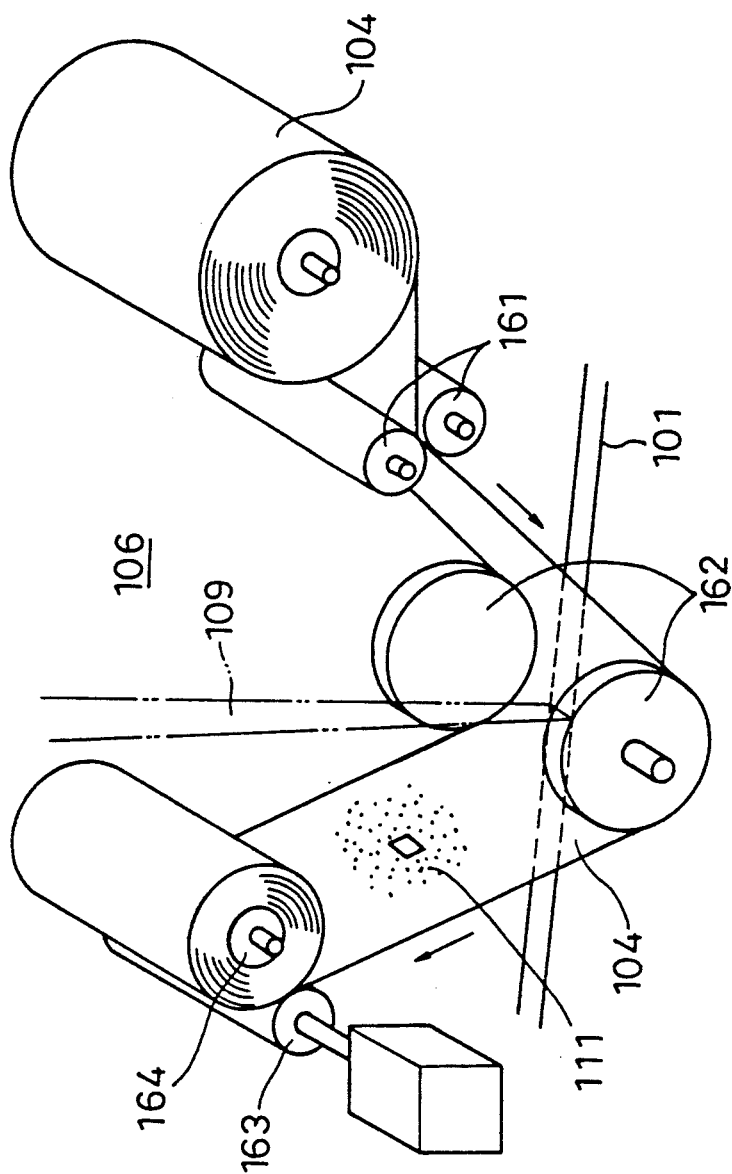
FIG. 18 is a perspective view showing the arrangement of a tape feeding apparatus which constitutes a second cutting apparatus of the second embodiment.

As shown in FIG. 17(a), the first cutting apparatus comprises a carrier mechanism 107 on which a printed wiring board 119 is placed, a laser apparatus 108, and a suction nozzle 103 connected to an external exhaust system 139.

The carrier mechanism 107 is composed of an XY table 171 on which the printed wiring board 119 is placed, and a controller 172 for executing numerical control to move the XY table 171 to a desired position on a plane.

For the laser apparatus 108, a YAG laser capable of pulsation is used. A laser beam 109 output from the apparatus 108 is focused on the printed wiring board 119, and a mask 181 is arranged midway in the travel path of the laser beam. The width of the laser beam 109 is adjusted to be equal to that of a wiring pattern 101 by the mask 181. The mask 181 has three holes of different sizes cut therein, and is displaced for selection of the holes such that the width of the laser beam 109 focused on the printed wiring board 119 corresponds to one of the three wiring widths 0.3 mm, 0.2 mm and 0.1 mm.

The laser apparatus 108 is capable of changing the pulse width, pulse height, irradiation interval, and number of irradiations of the laser beam 109 to respective predetermined values. For example, one pulse of the laser beam 109 can evaporate a 0.1-$\mu$m thickness of the copper foil wiring pattern 101, and thus a wiring pattern of about 50 $\mu$m thick can be cut when applied with about 500 pulses of the laser beam. Since the width of the laser beam 109 is adjusted by the mask 181 in accordance with the wiring width, the output setting of the laser apparatus 108 need not be changed according to wiring widths.

Figure 17B:
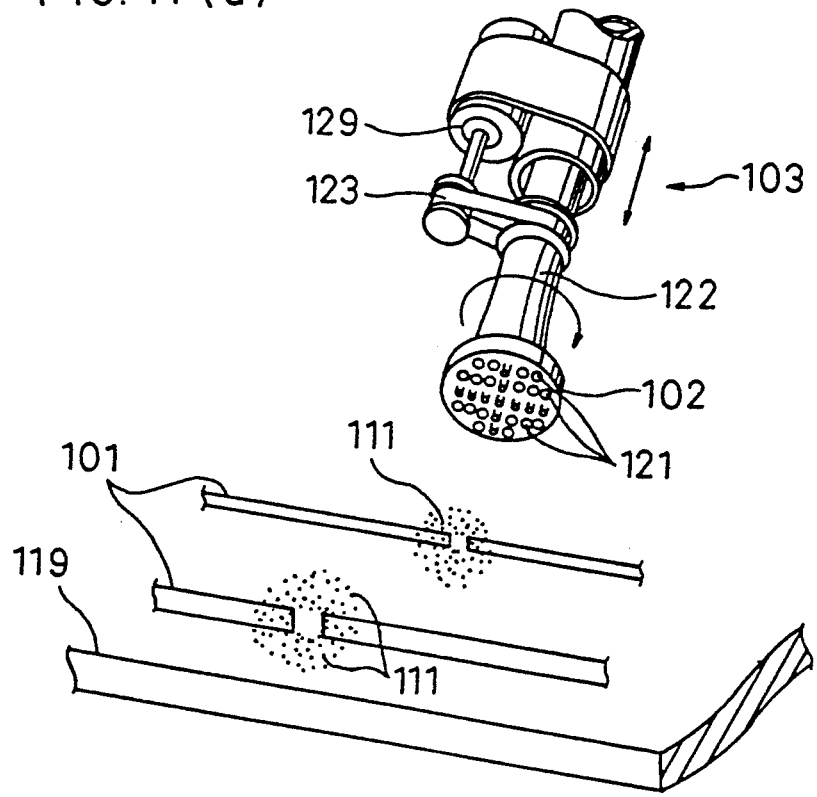

The suction nozzle 103 is connected to the external exhaust system 139, of which the internal pressure is reduced, through an airtight pipe. A rotary flat brush 102 is attached to the distal end of the nozzle 103 via a shaft tube 122, as shown in FIG. 17(b). The shaft tube 122 is connected at one end to the suction nozzle 103 by an airtight bearing, and a belt 123 is passed around the shaft tube 122 so that the tube 122 can be rotated by a drive unit 129 comprising a motor.

The other end of the shaft tube 122, which has an outer diameter of 5 mm, is closed by the rotary flat brush 102. Filaments of 1.5 mm long are set into the base of the rotary flat brush 102 in the form of a cross, and a large number of vent holes 121 are bored through the base adjacent to the filaments.

The suction nozzle 103 can be moved (lowered) in a direction at a right angle to the surface of the printed wiring board 119, whereby a cut spot of the wiring pattern 101 and its surrounding region of the printed wiring board 119 can be swept with the rotary flat brush 102.

In this apparatus, after the printed wiring board 119 is placed on the XY table 171 of the carrier mechanism 107, the controller 172 automatically positions the printed wiring board 119.

First, design information is input, whereupon the XY table 171 is moved such that the cutting position of the pattern coincides with the irradiation position of the laser beam 109. The width of the laser beam 109 is then adjusted by the mask 181 in accordance with the width of the wiring pattern 101. This adjustment prevents other delicate insulating materials from being damaged by heat, and the width of the laser beam 109 can be easily and quickly adjusted to one of a plurality of wiring widths by simply displacing the mask 181 to select the required beam transmission hole.

After the cutting operation by means of laser beam irradiation is completed, the XY table is moved to the next cutting position, and all of the required cutting operations are successively carried out.

Subsequently, the XY table 171 is moved such that a cut spot is located at a position just below the suction nozzle 103, and molten particles (scattered matter) 111 adhering to a region near the cut spot are removed. More specifically, the suction nozzle 103 is moved to the cut spot of the printed wiring board 119, then the particles 111 are swept off by the rotary flat blush 102, and the detached particles 111 are suck up into the vent holes 121. After the suction is completed, the suction nozzle 103 is moved away from the printed wiring board 119, the XY table is moved such that the next cut spot is located just below the suction nozzle 103, and a similar removing operation is carried out. When the removing operation is complete for all of the cut spots, the printed wiring board 119 is moved to the original position by the XY table 171, and then detached.

With reference to the second cutting apparatus, only those parts different from the corresponding parts of the first cutting apparatus will be described. As shown in FIG. 18, the second cutting apparatus uses a different means for removing the particles 111, and a tape feeding apparatus 106 is used in place of the suction nozzle 103.

The tape feeding apparatus 106 comprises a pair of feed rollers 161 urged against each other and applied with a braking force; a press roller 162 composed of two concentric discs which are made of hard rubber, have a size of 15 mm in diameter and 3 mm in thickness, are spaced from each other at a distance of 6 mm, and which are journaled from outside; a drive roller 163 rotated intermittently; and a take-up roller 164 urged against the drive roller 163. The drive roller 163 and the take-up roller 164 are arranged above and on one side with respect to the press roller 162, and the feed roller 161 and a bobbin around which a tape 104 is wound are arranged above and on the other side with respect to the press roller 162.

The tape 104, which is made of incombustible vinyl chloride and 12 mm wide and 0.05 mm thick, is passed along the feed roller 161 and the press roller 162 over to the take-up roller 164.

The tape feeding apparatus 106 first lowers to push the press roller 162 against the printed wiring board 119, whereby the tape 104 comes into close contact with the cut spot of the wiring pattern 101. While in this state, the laser beam 109 is irradiated from above through the space between the paired discs of the press roller 162. After the cutting operation is completed, the tape feeding apparatus 106 is elevated, and the tape 104, to which particles 111 produced by the laser beam irradiation adhere, is wound up for a length of about 10 mm by the take-up roller 164, such that the contaminated surface is wound inside and faces the core of the roller 164. The tape wind is achieved by intermittently rotating the drive roller 163. In the case of cutting a wiring pattern of 0.3 mm wide, the particles 111 scatter over a region enclosed by a circle with a radius of about 1 mm. Thus, the tape wind of about 10 mm is long enough to collect the particles 111.

As described above, the laser beam 109 is applied to the cutting spot of the printed wiring board 101, with the cutting spot surrounded by the paired discs of the press roller 162 and the tape 104, whereby the particles 111 never scatter to the outside, and adhere to the tape 104. Further, since the tape is wound up by the take-up roller 164 such that the contaminated surface is wound inside to face the core of the roller 164, the particles 111 can be perfectly removed. During the cutting operation, a hole is first made in the tape 104 by the laser beam 109, but since the tape 104 is made of an incombustible material, the hole does not expand over the laser irradiated spot. Further, the hole in the tape has substantially the same size as the cut spot of the wiring pattern, and thus the particles do not fall off through the hole when the tape 104 is wound.

In the above embodiment, a YAG laser is used for the laser apparatus 108, but an excimer laser may alternatively be used.

Further, an incombustible sheet may be used in place of the tape 104, in such a manner that the incombustible sheet is disposed in close contact at least with the cutting spot of the printed wiring board 119. The laser beam is applied from above to the sheet to cut the wiring pattern, and the sheet is removed.

Furthermore, instead of using the mask 181 having a plurality of holes cut therein, a plurality of masks each having a single hole may be prepared for replacement.

Thus, according to the second embodiment, printed wiring can be accurately cut with ease, and particles produced during the cutting operation can be perfectly removed. Further, the cutting work can be automated.

Next, a method of adjusting the mask size during the internal-layer pattern cutting, which constitutes a third embodiment of this invention, will be described.

Figure 19:
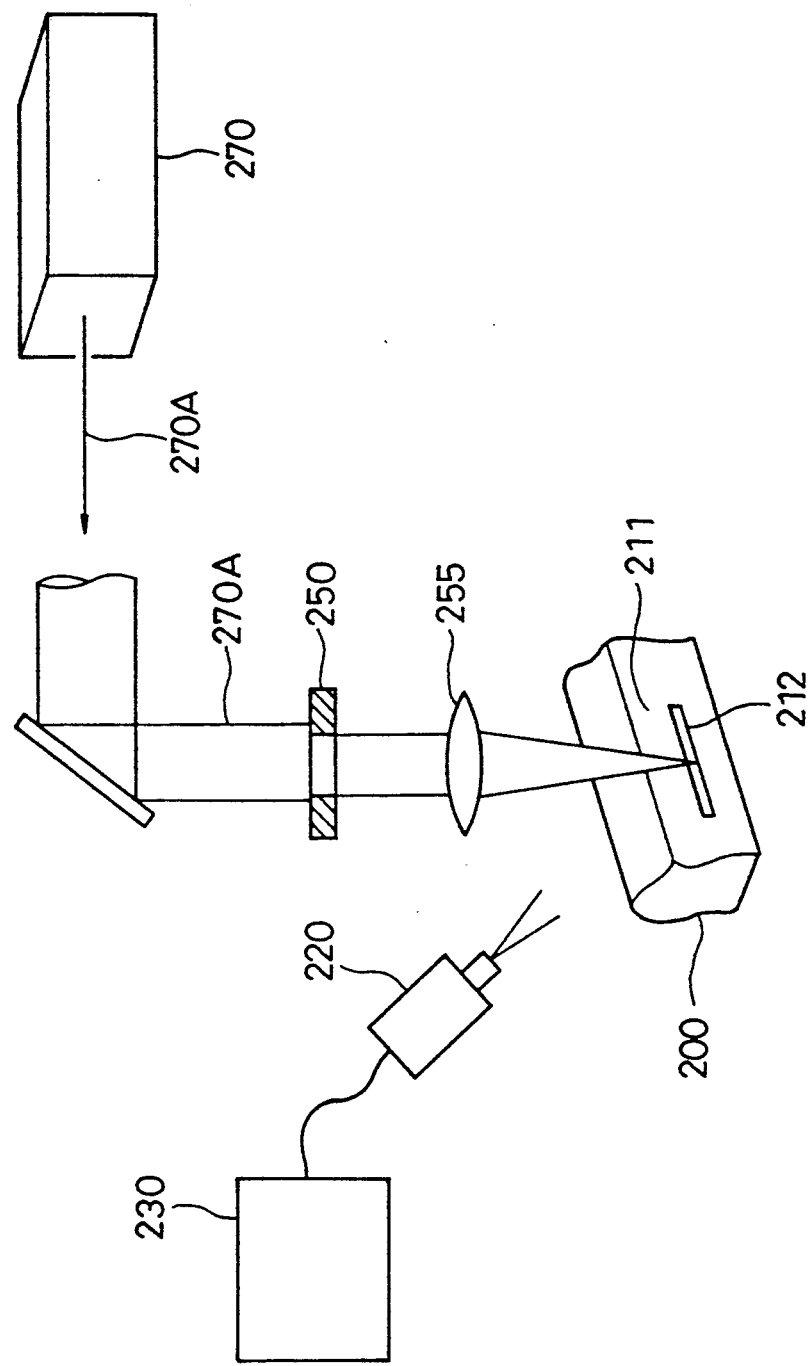
FIG. 19 is a diagram illustrating the entire arrangement of an internal-layer pattern cutting apparatus according to a third embodiment.

FIG. 19 illustrates the entire arrangement of an internal-layer pattern cutting apparatus according to the third embodiment. In the figure, a laser beam 270A from a laser oscillator 270 is irradiated onto a multilayered printed wiring board 200, to remove a first resin layer 211 and to cut a first internal-layer pattern 212. A camera 220 photographs the first resin layer 211 and the first internal-layer pattern 212 under natural light emitted from a natural-light radiating apparatus, not shown, and supplies acquired image data to an image processor 230. Based on the image data supplied from the camera 220, the image processor 230 detects the completion of removal of the first resin layer 211, as well as the completion of cutting of the first internal-layer pattern 212. Further, when the first resin layer 211 has been removed, the image processor 230 determines the width W of the first internal-layer pattern 212 on the basis of data obtained by photographing the first internal-layer pattern 212 with the camera 220. A metal mask 250 is arranged across the optical path of the laser beam 270A. The metal mask 250 has the same structure as that shown in FIG. 5, and the mask size is adjusted in accordance with the width of the first internal-layer pattern 212. Consequently, a beam of the laser light 270A passed through the metal mask 250 is converged by a lens 255 such that when it reaches the first internal-layer pattern 212, the beam width coincides with the width of the first internal-layer pattern 212, whereby the pattern 212 is accurately cut for that width.

In the following, a procedure for detecting completion of the removing and cutting operations, a procedure for detecting the width W of the first internal-layer pattern 212, and a procedure for adjusting the width of the metal mask will be described.

Figure 20A:
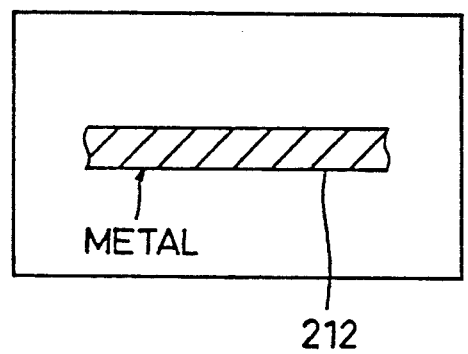
FIG. 20 illustrates a procedure for detecting completion of a first internal-layer pattern cutting, in which (A) is a view showing a display image obtained by a camera and showing the first internal-layer pattern which is not yet cut, and (B) is a view of an image showing the cut first internal-layer pattern.
Figure 20B:
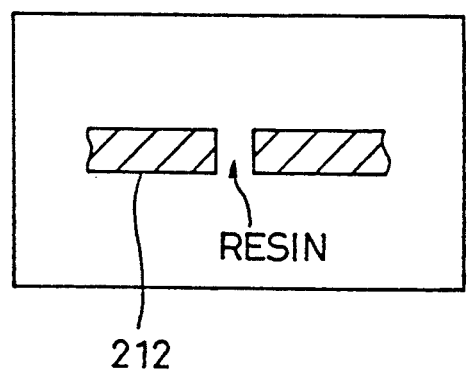

FIG. 20 illustrates how completion of the cutting of the first internal-layer pattern is detected, wherein (A) shows an image obtained by the camera and representing a state in which the first internal-layer pattern is not yet cut, and (B) shows an image representing a state in which the pattern cutting is completed. The camera 220 photographs the first internal-layer pattern 212, and the image processor 230 processes the image photographed before completion of the cutting operation, shown in FIG. 20(A), and determines the quantity of light reflected from the metal (usually, copper) of the first internal-layer pattern 212. The image processor 230 also processes the image photographed after completion of the cutting operation, shown in FIG. 20(B), and determines the quantity of light reflected from the resin (e.g., glass epoxy resin) exposed at the cut spot. Generally, there is a noticeable difference between the quantity of light reflected from a metal and that reflected from a resin. Based on this difference, it is determined that the cutting of the first internal-layer pattern 212 is completed, when a change of state from metal to resin, i.e., a change in the quantity of reflected light, is detected. Whether the removal of the first resin layer 211 has been completed is determined in a manner converse to the above, namely by detecting a change of state from resin to metal, i.e., a corresponding change in the quantity of reflected light. Instead of detecting the change of state based on the difference between the quantity of light reflected from metal and that reflected from resin, a color image may be subjected to image processing so that the change of state may be detected based on the difference in color between metal (copper-colored) and resin (e.g., green).

Figure 21:
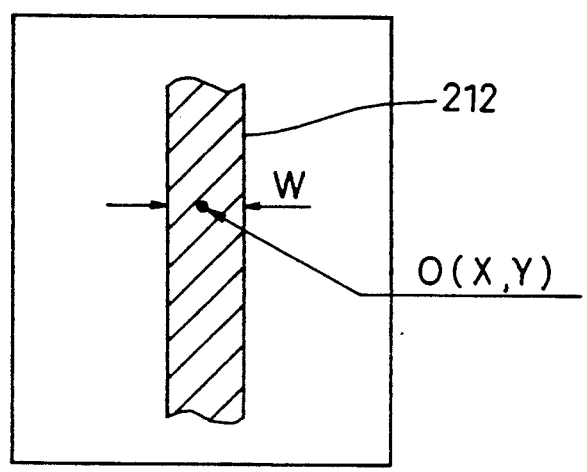
FIG. 21 is a diagram illustrating how the width of the first internal-layer pattern is recognized.

FIG. 21 illustrates how the width of the first internal-layer pattern is detected. After the removal of the first resin layer 211 is completed, the camera 220 photographs the exposed first internal-layer pattern 212. FIG. 21 illustrates a photographed image showing such state. Based on the data of the acquired image, the image processor 230 obtains the width W and coordinates O(X, Y) of the lateral center of the first internal-layer pattern 212. Using the coordinates O(X, Y), the position of the printed wiring board 200 is precisely adjusted, and using the obtained width W, the width of the metal mask 250 is adjusted.

The procedure for cutting the first internal-layer pattern 212 will be now described.

FIG. 22 illustrates the procedure for cutting the internal-layer pattern. As illustrated, the printed wiring board 200 has a multilayered structure composed of a surface layer 210, the aforesaid first resin layer 211 and first internal-layer pattern 212, a second resin layer 213, a second internal-layer pattern 214, etc. In the following, how the first internal-layer pattern 212 is cut for the width W will be explained.

First, the first resin layer 211 is removed by the laser beam 270A. One pulse of the laser beam 270A removes about 0.4-$\mu$m thickness of resin (e.g., glass epoxy resin), and the resin is removed for a width W2 greater than the width W of the first internal-layer pattern 212 and in the form of a rectangle or circle as viewed from above. As the removal of the first resin layer 211 progresses, the first internal-layer pattern 212 becomes exposed.

The camera 220 retains the first resin layer 211 and the first internal-layer pattern 212 within the visual field thereof, and the image processor 230 detects a change of state from resin to metal on the basis of the data of the obtained image. On detecting a change of state from resin to metal, it is determined that the removal of the resin by the laser beam 270A has completed.

Subsequently, the camera 220 photographs the exposed first internal-layer pattern 212, and the image processor 230 obtains the width W and the coordinates O(X, Y) of the lateral center of the first internal-layer pattern 212 on the basis of the data of the acquired image. Based on the width W and the coordinates O(X, Y), the laser beam 270A is accurately irradiated onto the first internal-layer pattern 212. Thus, as shown in FIG. 22, the laser beam 270A falls upon the first internal-layer pattern 212 without being deviated, and damage to the second resin layer 213 can be minimized.

One pulse of the laser beam 270A irradiated onto the first internal-layer pattern 212 melts and removes about 0.1-$\mu$m thickness of the metal. As the cutting of the first internal-layer pattern 212 progresses, the second resin layer 213 becomes exposed. The camera 220 retains the first internal-layer pattern 212 and the second resin layer 213 within the visual field thereof, and the image processor 230 detects a change of state from metal to resin on the basis of the data of the obtained image. Upon detecting a change of state from metal to resin, it is determined that the cutting of the first internal-layer pattern 212 by the laser beam 270A has completed.

Figure 23:
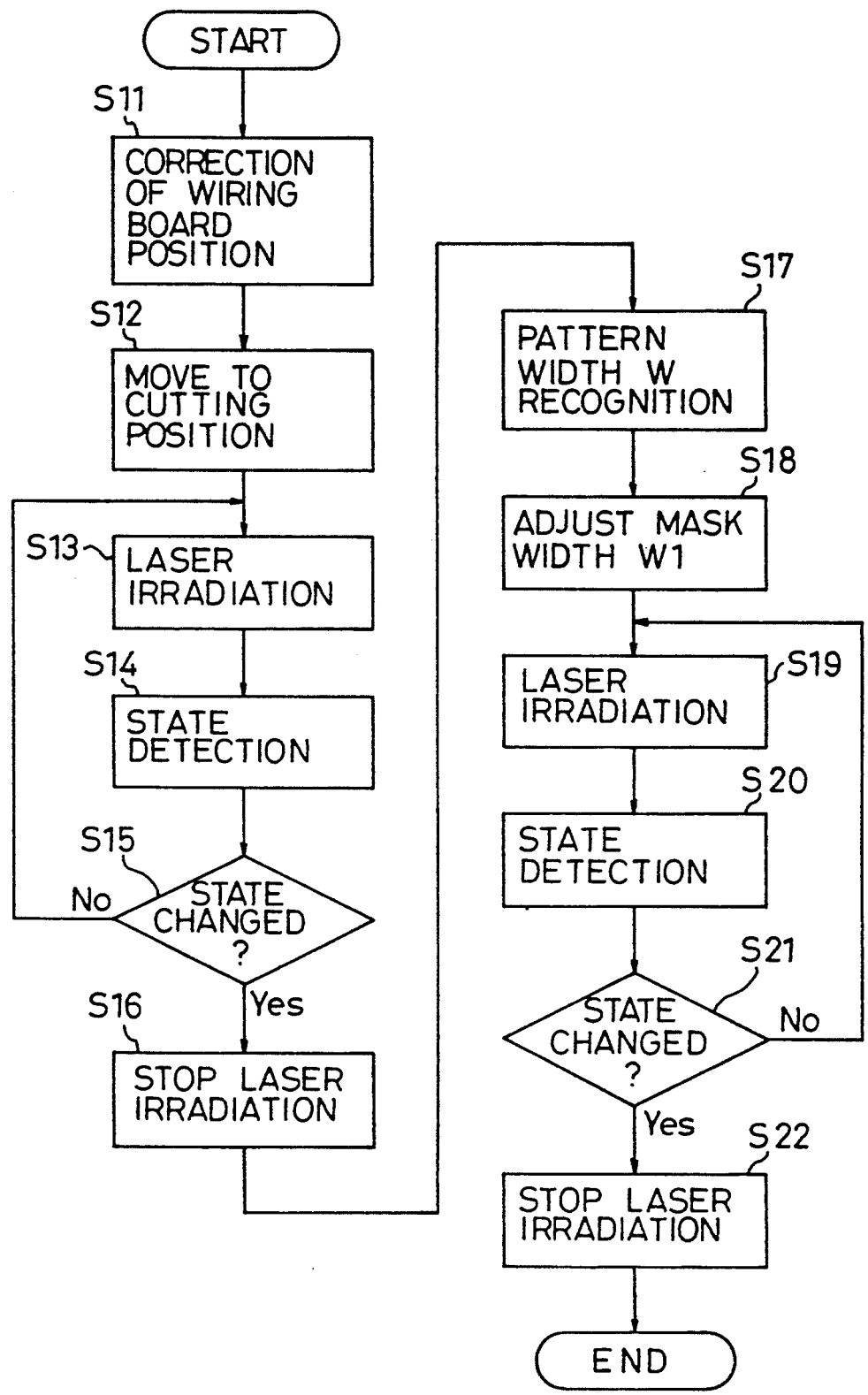
FIG. 23 is a flow chart for carrying out an internal-layer pattern cutting method according to a third embodiment.

FIG. 23 is a flow chart for executing the internal-layer pattern cutting method according to this embodiment. In the chart, the numbers following "S" represent step numbers.

[S11] The position of the printed wiring board 200 is corrected.

[S12] The printed wiring board 200 is moved to a position where a spot to be cut can be irradiated with the laser beam 270A.

[S13] The laser beam 270A is emitted to remove the first resin layer 211.

[S14] A change of state from resin to metal is detected.

[S15] It is determined whether the change of state has been detected. If the change has occurred, the program proceeds to Step S16, and if not, the program returns to Step S13.

[S16] Since the removal of the first resin layer 211 has completed, the emission of the laser beam 270A is stopped.

[S17] The width W and the coordinates O(X, Y) of the lateral center of the first internal-layer pattern 212 are determined based on the data of an obtained image.

[S18] In accordance with the obtained width W, the width W1 of the metal mask 250 is adjusted. Further, the position of the printed wiring board 200 is precisely adjusted in accordance with the coordinates O(X, Y).

[S19] The laser beam 270A is irradiated onto the first internal-layer pattern 212.

[S20] A change of state from metal to resin is detected.

[S21] It is determined whether the change of state has been detected. If the change has occurred, the program proceeds to Step S22, and if not, the program returns to Step S19.

[S22] Since the cutting of the first internal-layer pattern 212 has completed, the emission of the laser beam 270A is stopped.

Figure 24:
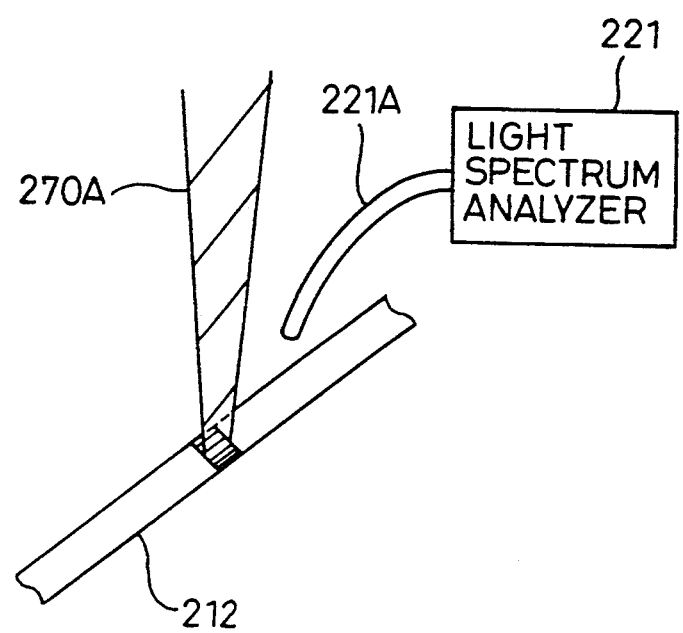
FIG. 24 is a diagram showing a second example of state change detection.

Another example of detecting a change of state is illustrated in FIG. 24. In this example, a light spectrum analyzer 221 is used for detecting the change of state. Combustion light emitted from the first internal-layer pattern 212 when the laser beam 270A is irradiated thereon is transmitted to the light spectrum analyzer 221 through a fiber 221A, and the spectrum analyzer 221 detects a change of state on the basis of a spectral change (wavelength change) of the combustion light. As shown in FIG. 25, the wavelength range of the combustion light is from 0.43 to 0.49 $\mu$m when the laser beam 270A is applied to a metal, and is from 0.64 to 0.77 $\mu$m when the laser beam 270A is applied to a resin. Thus, the wavelength range for metal clearly differs from that for resin. Accordingly, by detecting a change in the spectrum, the light spectrum analyzer 221 determines a change of state from resin to metal or vice versa.

Figure 26:
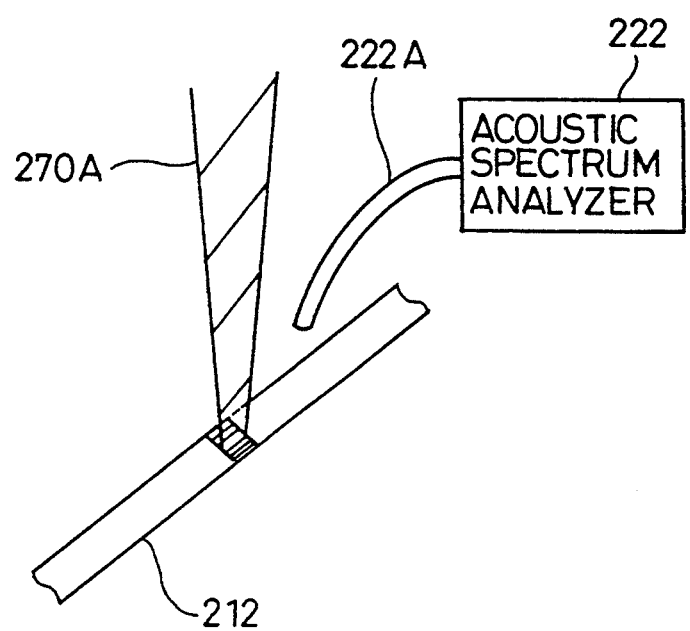
FIG. 26 is a diagram showing a third example of the state change detection.

FIG. 26 illustrates still another example of detecting a change of state. In this example, an acoustic spectrum analyzer 222 is used for detecting the change of state. Combustion noise produced when the laser beam 270A is irradiated onto the first internal-layer pattern 212 is transmitted to the acoustic spectrum analyzer 222 through a pipe 222A, and the spectrum analyzer 222 detects a change of state on the basis of a spectral change (wavelength change) of the combustion noise. The combustion noise of metal clearly differs from that of resin, and thus, by detecting a change in the spectrum, the acoustic spectrum analyzer 222 determines a change of state from resin to metal or vice versa.

Figure 27:
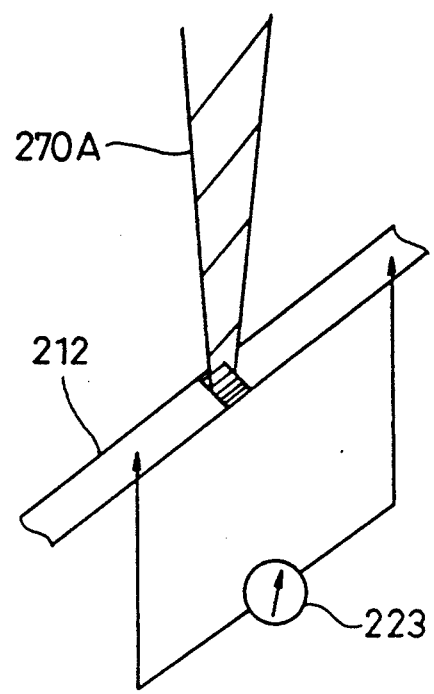
FIG. 27 is a diagram showing a fourth example of the state change detection.

FIG. 27 illustrates a further example of detecting a change of state. In this example, a change from metal to resin is determined by detecting a change of the electrical resistance between two points on opposite sides of a cutting spot of the first internal-layer pattern 212. Namely, when the first internal-layer pattern 212 is cut by the laser beam 270A, the electrical resistance between the two points on opposite sides of the cut spot greatly changes. Thus, the electrical resistance is detected by a resistance detector 223, and when the amount of change of resistance exceeds a predetermined level, it is determined that the cutting of the first internal-layer pattern 212 has been completed.

In the foregoing embodiment, the first internal-layer pattern of a multilayer printed wiring board is cut, but the second internal-layer pattern below the first pattern or other internal-layer patterns can of course be cut.

Thus, according to the third embodiment, in the first stage, the resin layer on the internal-layer pattern is removed so that the internal-layer pattern can be directly observed, whereby the width of the internal-layer pattern can be accurately determined. In the second stage, the laser beam is irradiated in accordance with the width of the internal-layer pattern to cut the pattern. Thus, the laser beam can be accurately irradiated in accordance with the width of the internal-layer pattern. Accordingly, damage to the resin layer below the internal-layer pattern can be minimized, and the internal-layer pattern can be properly cut. Further, completion of the removal of the resin layer is determined by detecting a change of state from resin to metal, and completion of the cutting of the internal-layer pattern is determined by detecting a change of state from metal to resin, whereby whether the removal of the resin layer or the cutting of the metal has completed can be accurately determined. Accordingly, unnecessary irradiation of the laser beam is prevented, and also in this regard, the internal-layer pattern can be properly cut.

The following is a description of an embodiment in which the entire printed wiring board is cleaned with a laser beam.

Figure 28:
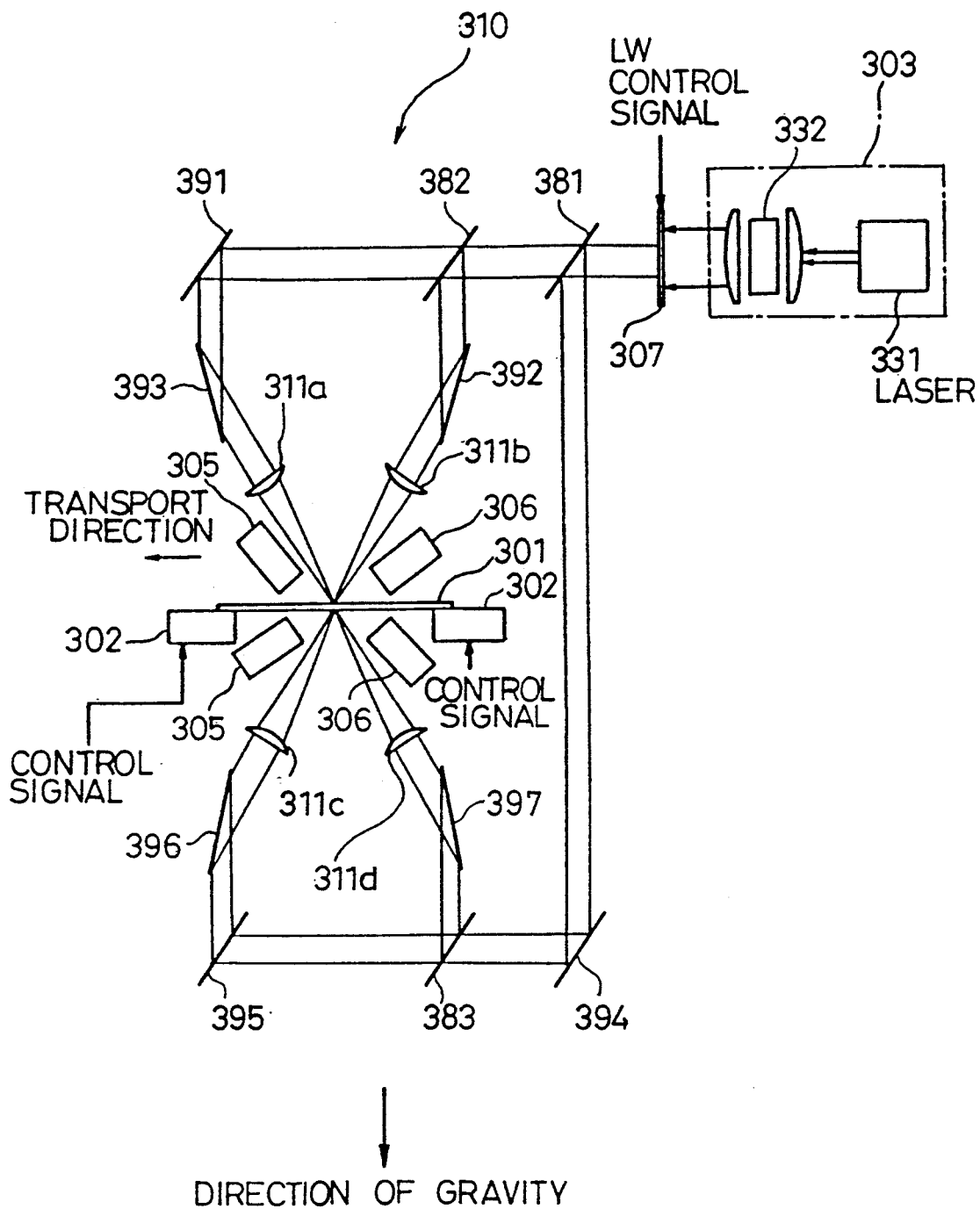
FIG. 28 is a diagram illustrating the entire arrangement of a pattern cleaning apparatus for printed wiring boards according to an embodiment.

FIG. 28 is a block diagram showing the embodiment. As shown in the figure, a cleaning apparatus 310 for printed wiring boards, which uses a laser beam, comprises an XY stage 302 for holding a printed wiring board 301; two high-pressure gas blowers 305 facing the obverse and reverse of the printed wiring board 301, respectively; two gas aspirators 306 facing the obverse and reverse of the printed wiring board 301, respectively; an ultraviolet laser beam radiation apparatus 303; a mask 307; three half-mirrors 381 to 383; seven total-reflection mirrors 391 to 397; and four cylindrical lenses 311a to 311d.

The XY stage 302 holds the printed wiring board 301 and also moves the same in X- and Y-axis directions perpendicular to each other. Namely, the XY stage 302 can move the printed wiring board 301 freely on a plane.

The ultraviolet laser beam radiation apparatus 303 emits a laser beam to the printed wiring board 301 held by the XY stage 302, and comprises an ultraviolet laser 331 and a kaleidoscope 332.

The ultraviolet laser 331 is active in the ultraviolet region, amplifies electromagnetic waves by means of stimulated emission, and outputs a narrow ultraviolet laser beam (excimer, $\frac{1}{4}$-wavelength YAG). The ultraviolet laser is used because its photon energy is large and because the intermolecular binding of a thin surface layer (0.1 $\mu$m in thickness) of the printed wiring board 301 can be dissociated without generating heat.

The kaleidoscope 332 receives the narrow ultraviolet laser beam at a light-receiving side thereof, enlarges or diverges same at uniform density, and outputs a thick ultraviolet laser beam at a light-emitting side thereof.

The high-pressure gas blowers 305 eject gas at a high pressure, to blow off floating particles, produced during the irradiation of the ultraviolet laser beam, toward the gas aspirators 306.

The gas aspirators 306 withdraw gas therein to remove the floating particles produced during the laser irradiation and blown by the high-pressure gas blowers 305, thereby preventing the floating matter from adhering to the printed wiring board 301.

Figure 29:
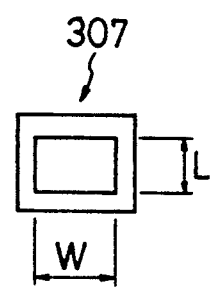
FIG. 29 is a view of a variable-aperture type mask.

The mask 307 is a variable-aperture type, and the length L and width W of the aperture, shown in FIG. 29, are changed in accordance with a control signal, to shape the cross section of the incoming ultraviolet laser beam according to the aperture shape. Namely, the mask 307 adjusts the size (length and width) of the cross section of the ultraviolet laser beam by changing the length L and width W of the aperture thereof.

The half-mirrors 381 to 383 each split the incoming ultraviolet laser beam into two beams of equal intensity ($\frac{1}{2}$ of the original intensity), which beams are transmitted in respective different directions. Each of the total-reflection mirrors 391 to 397 totally reflects the incident ultraviolet laser beam into another direction, without reducing its intensity.

The cylindrical lenses 311a, 311b, 311c and 311d each converge the ultraviolet laser beam incident on a surface thereof opposite the convex surface, only in one direction such that only one side of the cross section of the laser beam is reduced, whereby the beam is focused in the form of a slit. In the illustrated example, each cylindrical lens converges the laser beam in the direction corresponding to the length L of the mask 307.

With the arrangement described above, as shown in FIG. 28, a narrow ultraviolet laser beam output from the ultraviolet laser 331 is enlarged at uniform density by the kaleidoscope 332, and the enlarged laser beam is shaped by the mask 307 according to the aperture shape which is changed by the control signal.

The half-mirror 381 receives the ultraviolet laser beam shaped by the mask 307, and splits it into two beams of equal intensity (half the original intensity). This output beam having half the original intensity is hereinafter called "$\frac{1}{2}$ ultraviolet laser beam." The two $\frac{1}{2}$ ultraviolet laser beams split by the half-mirror 381 are guided in two directions, i.e., to the upper and lower sides, respectively, of the printed wiring board 301 held by the XY stage 302.

The half-mirror 382 receives one of the two $\frac{1}{2}$ ultraviolet laser beams and splits it into two beams of equal intensity which is half that of the received beam. This output beam having an intensity half that of the $\frac{1}{2}$ ultraviolet laser beam is hereinafter called "$\frac{1}{4}$ ultraviolet laser beam."

The $\frac{1}{4}$ ultraviolet laser beams from the half-mirror 382 respectively fall upon the total-reflection mirrors 391 and 392. The $\frac{1}{4}$ ultraviolet laser beam incident on the total-reflection mirror 391 is totally reflected thereby and directed to the total-reflection mirror 393.

The $\frac{1}{4}$ ultraviolet laser beam incident on the total-reflection mirror 392 is totally reflected thereby to fall upon the cylindrical lens 311a, such that the angle of incidence of the laser beam upon the printed wiring board 301 held by the XY stage 302 is maintained at a specified angle.

The $\frac{1}{4}$ ultraviolet laser beam incident on the total-reflection mirror 393 is totally reflected thereby, as in the case of the total-reflection mirror 392. In this case, the $\frac{1}{4}$ ultraviolet laser beam is guided to the cylindrical lens 311b such that the laser beam falls upon the printed wiring board 301 from the opposite side of the total-reflection mirror 392, while maintaining a specified incident angle.

The $\frac{1}{4}$ ultraviolet laser beams thus guided at the specified angle are converged by the cylindrical lenses 311a and 311b, respectively, only in one direction corresponding to the length L of the cross section of the laser beam.

Figure 30:
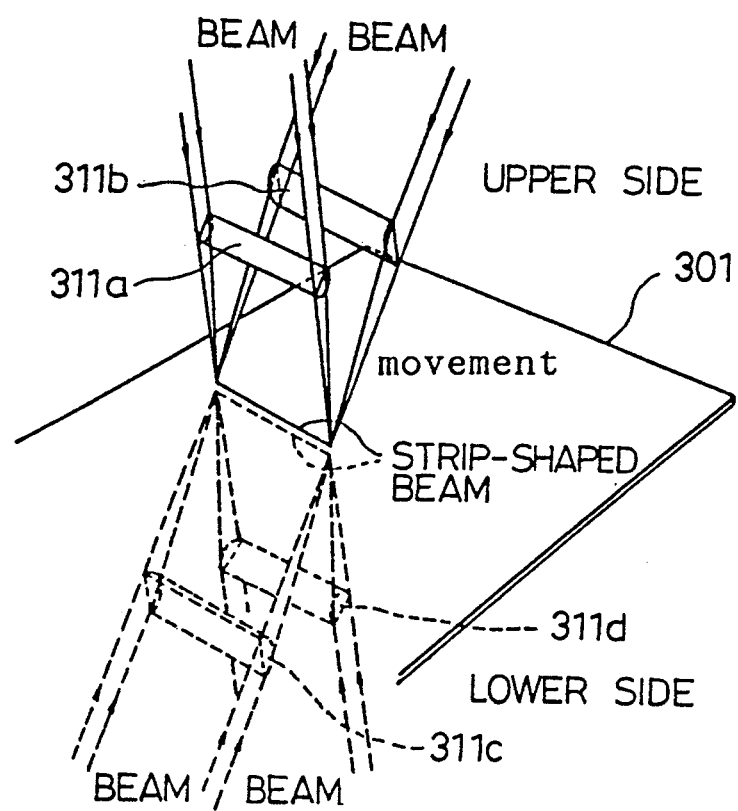
FIG. 30 is a view showing cylindrical lenses and laser beams.

As a result, the two $\frac{1}{4}$ ultraviolet laser beams (strip-shaped ultraviolet laser beams) simultaneously fall upon the printed wiring board 301 obliquely from two directions and focus in the form of a slit on a surface region to be cleaned (see the upper part of FIG. 30).

The laser beam transmitted toward the lower side of the printed wiring board is guided in a manner similar to the above-described case, by the total-reflection mirrors 394 to 397 and the half-mirror 383. Consequently, the two strip-shaped ultraviolet laser beams simultaneously fall upon the reverse side of the printed wiring board 301 obliquely from two directions and focus in the form of a slit on a reverse surface region to be cleaned (which region is right behind the irradiated region of the obverse surface) (see the lower part of FIG. 30).

With the ultraviolet laser beams falling upon the printed wiring board 301, the XY stage 302 is moved in the X and Y directions in accordance with the control signal based on preset movement data, while holding the printed wiring board 301.

Figure 31:
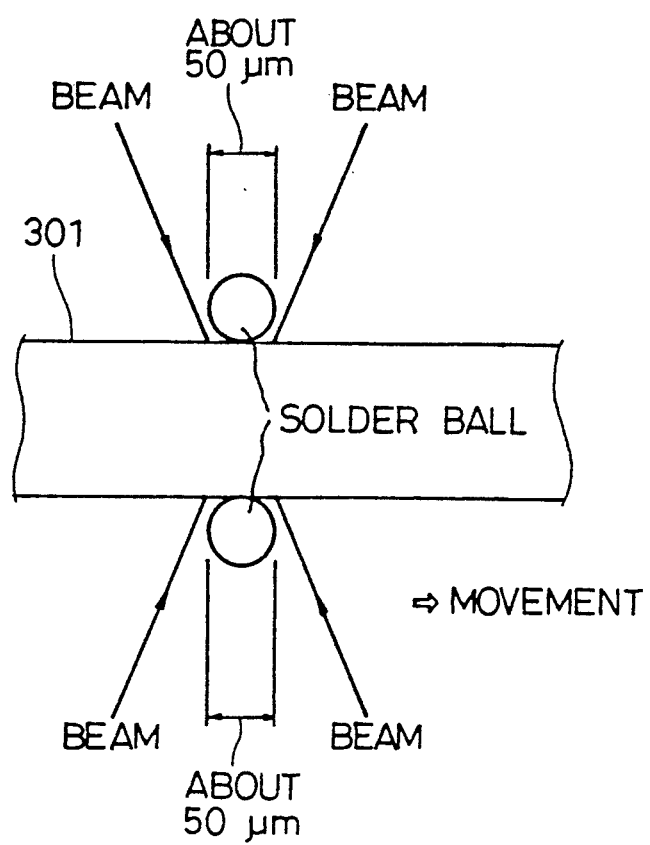
FIG. 31 is a diagram showing dry-cleaning of a printed wiring board.

Consequently, the obverse and reverse sides of the printed wiring board 301 are dry-cleaned, as shown in FIG. 31. That is, each surface region irradiated with the beams obliquely from two directions instantly evaporates. The vapor collides with solder balls at an extremely high speed, and such contaminant as solder bolls on both sides of the wiring board is removed by the force of collision of the evaporated matter.

Simultaneously, the high-pressure gas blowers 305, arranged near the printed wiring board 301, blow off floating matter produced during the irradiation of the ultraviolet laser beams, toward the gas aspirators 306.

The floating matter blown off by the high-pressure gas blowers 305 is sucked into the gas aspirators 306. In this way, the laser beams are irradiated onto the entire printed wiring board 301, and the obverse and reverse sides of the board 301 are each removed for a predetermined thickness (about 0.1 $\mu$m) over the entire area, whereby contaminants adhering to the board, such as flux and solder balls, are removed and the board is cleaned.

In the case where the output of the ultraviolet laser beam is not suitable for cleaning the printed wiring board 301, it is adjusted by the ultraviolet laser beam radiation apparatus 303 and the mask 307. When adjusting the laser output by the mask 307, the length L of the aperture shown in FIG. 29 is changed. In this example, the length L of the mask 307 corresponds to the longitudinal direction of the cylindrical lens, and thus the laser output increases in proportion as the length L is increased. Therefore, the length L of the mask 307 is increased to raise the output of the ultraviolet laser beam, and is reduced to lower the laser output.

Figure 32A:
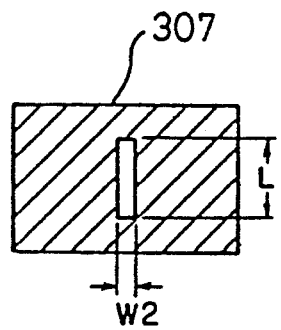
FIG. 32 is a diagram showing the relationship between the variable-aperture type mask and a strip-shaped laser beam.
Figure 32B:
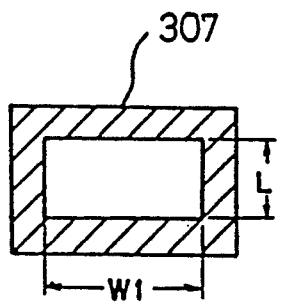
Figures 32C, 32D:
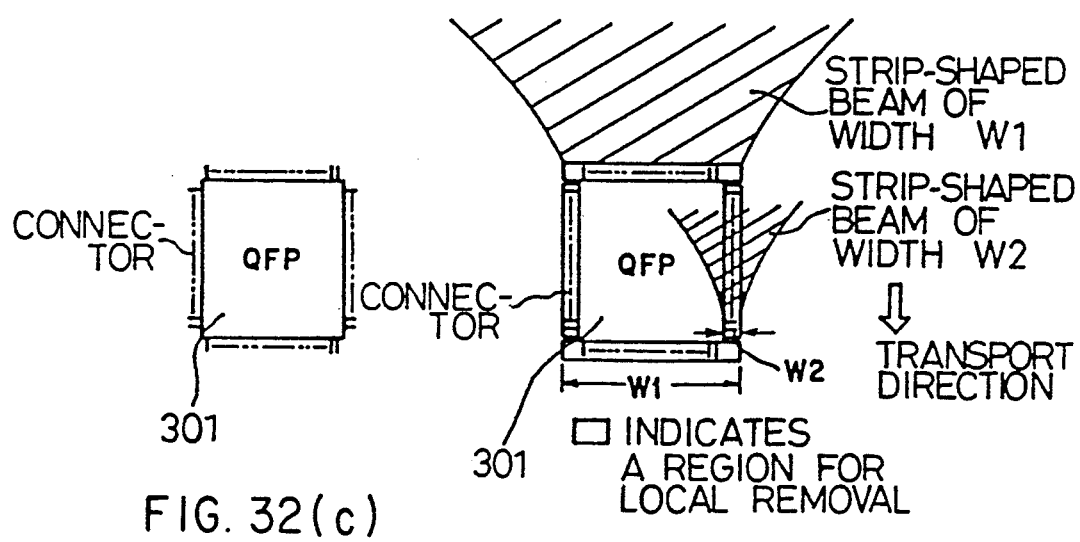

When cleaning a restricted part, e.g., connectors of a QFP (quad flat package) integrated circuit or the like, the width of the strip-shaped beam is adjusted in accordance with a spot to be cleaned, as shown in FIG. 32(d), to carry out the cleaning according to the cleaning spot.

More specifically, the width W of the aperture of the mask 307 corresponds to the lateral direction of the cylindrical lens, and thus the width of the strip-shaped ultraviolet laser beam changes as the width W of the aperture is changed. Thus, when cleaning QFP connectors aligned from side to side in FIG. 32(c), the width W of the aperture is set to W1 (which is slightly greater than the overall span of the aligned connectors) to obtain an enlarged beam, as shown in FIG. 32(b).

When cleaning only those QFP connectors aligned up and down in FIG. 32(c), the aperture width W is set to W2 (which is slightly greater than the length of each connector) to obtain a reduced beam for the cleaning, as shown in FIG. 32(a).

In the case where the output of the ultraviolet laser beam available is not high enough to carry out simultaneous cleaning of both sides of a printed wiring board, or the ultraviolet laser beam needs to be irradiated onto one side of the board at a time for reasons of manufacturing process, the half-mirror 381 is replaced with a total-reflection mirror.

In such cases, the substituted total-reflection mirror is operated so as to optically switch the beam toward the upper or lower side of the printed wiring board 301, so that only one side of the board 301 may be dry-cleaned with the cleaning apparatus 310 at a time.

Thus, using the XY stage 302 and the ultraviolet laser beam radiation apparatus 303, the obverse and reverse surfaces of the printed wiring board 301 are each irradiated with laser beams obliquely from two directions, and are removed for a required thickness, whereby the obverse and reverse sides of the printed wiring board 301 are dry-cleaned. Although the cleaning method used is a non-washing type, solder balls and flux can be removed and defective pin contact and the like can be eliminated. Further, the initial cost and running cost of the apparatus are low.

Furthermore, the laser beam is strip-shaped and a cleaning spot on each of the obverse and reverse sides of the printed wiring board 301 is irradiated with the strip-shaped laser beam obliquely from two directions, whereby the printed wiring board 301 can be efficiently cleaned.

Figure 33:
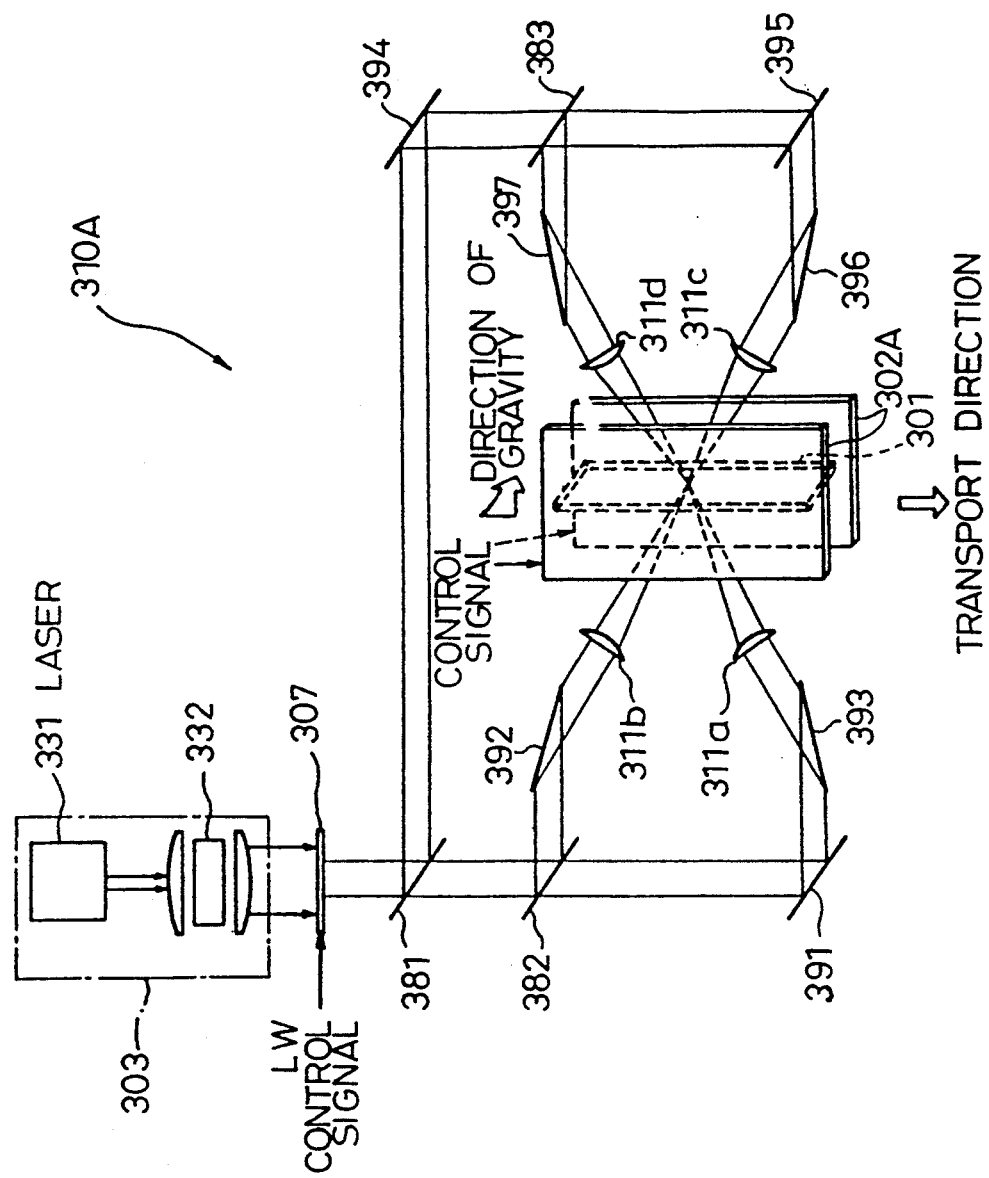
FIG. 33 is a view showing the entire arrangement of a pattern cleaning apparatus for printed wiring boards according to another embodiment.

FIG. 33 illustrates another embodiment, wherein a cleaning apparatus 310A differs from the cleaning apparatus 310 described above in that it is inclined by 90 degrees with respect to the direction of gravity. Thus, the printed wiring board 310 is cleaned while being held in an upright position.

This cleaning apparatus 310A differs from the above apparatus 310 only in orientation, and the arrangement is identical, except that an XY stage 302A is used in place of the XY stage 302 because the printed wiring board 301 is transported while being held in an upright state.

More specifically, the XY stage 302A holds the printed wiring board 301 in an upright position, and moves the board 301 in a transport direction indicated by arrow in FIG. 33, in accordance with a control signal.

Although not illustrated in FIG. 33, two high-pressure gas blowers 305 are arranged at a higher level than the location of ultraviolet laser beam irradiation, and two gas aspirators 306 are arranged at a level lower than the location of ultraviolet laser beam irradiation.

With the arrangement described above, both sides of the printed wiring board 301 are cleaned in the same manner as in the case of the cleaning apparatus 310. However, since the printed wiring board 301 is moved while being held in an upright state by the XY stage 302A, floating matter produced during the laser irradiation falls off without adhering to the board 301.

In addition, the high-pressure gas blowers 305 blow off the floating matter from above toward the gas aspirators 306, and the floating matter thus blown off are sucked into the gas aspirators 306 arranged at a lower level than the printed wiring board 301, whereby the floating matter can be further efficiently removed.

Thus, by moving the printed wiring board 301, held upright, by the XY stage 302A and irradiating the ultraviolet laser beam, the dry-cleaning work can be efficiently carried out.

Figure 34:
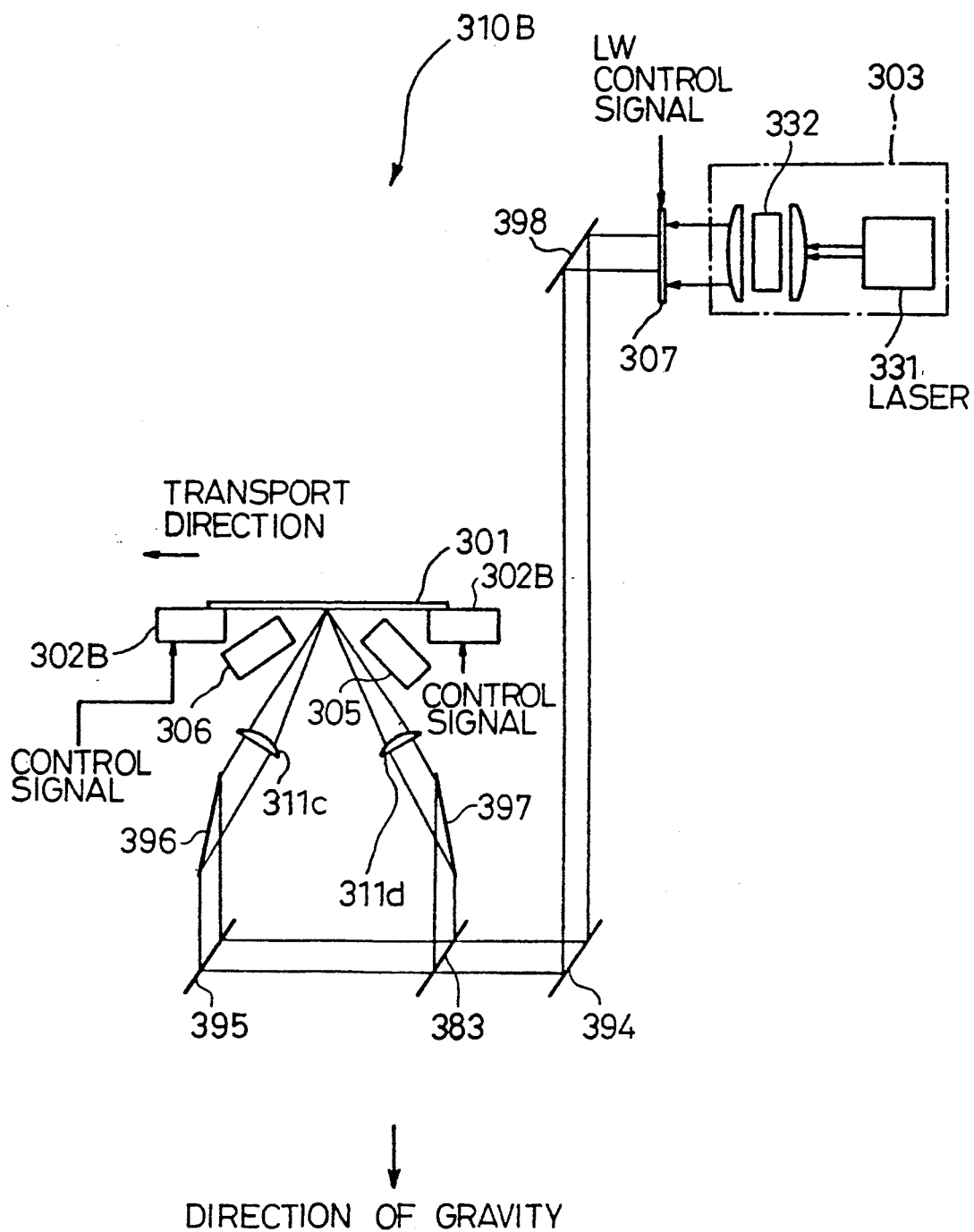
FIG. 34 is a view showing the entire arrangement of a pattern cleaning apparatus according to still another embodiment.

FIG. 34 illustrates still another embodiment, wherein a cleaning apparatus 310B differs from the apparatus 310 of FIG. 28 in that the laser beam is irradiated from below only.

Therefore, the various elements of the cleaning apparatus 310 of FIG. 28 used for irradiating the laser beam from above are omitted from the cleaning apparatus 310B. Specifically, the cleaning apparatus 310B does not have elements corresponding to the upper-side half-mirrors, upper-side total-reflection mirrors, upper-side cylindrical lenses, upper-side high-pressure gas blower 305, and upper-side gas aspirator 306 of the cleaning apparatus 310.

Further, the cleaning apparatus 310B uses a total-reflection mirror 398, in place of the half-mirror 381 of the cleaning apparatus 310, and an XY stage 302B in place of the XY stage 302. For other parts, the cleaning apparatus 310B has an arrangement similar to that of the apparatus 310.

The XY stage 302B not only moves the printed wiring board 301 in the X and Y directions, while holding the same, but also can turn the board 301 upside down.

With this arrangement, the ultraviolet laser beam is first irradiated obliquely from two directions onto a surface region of the printed wiring board 301 to be cleaned. Simultaneously, the printed wiring board 301 is moved by the XY stage 302B in accordance with preset movement data, whereby the surface region of the board 301 is removed for a predetermined thickness over the entire area, thereby dry-cleaning the surface of the board 301.

In this case, since the printed wiring board 301 is cleaned only from below, unlike the aforementioned embodiments, floating matter produced during the laser irradiation just falls and scarcely adheres to the wiring board 301.

Further, the high-pressure gas blower 305 blows off the floating matter toward the gas aspirator 306, so that the floating matter is sucked into the gas aspirator 306, whereby adhesion of the floating matter to the printed wiring board 301 can be further efficiently prevented.

When the cleaning of one side of the printed wiring board 301 is completed, the XY stage 302B turns the wiring board 301 upside down so that the cylindrical lenses 311c and 311d face the uncleaned surface. Then, the uncleaned or reverse surface of the wiring board is cleaned in the same manner as in the case of the obverse side.

Thus, the ultraviolet laser beams are irradiated obliquely from two directions onto one of the obverse and reverse sides of the printed wiring board 301, to remove a required thickness of the surface for dry-cleaning, and thereafter the other side of the wiring board is cleaned in a similar manner, whereby adhesion of the floating matter can be efficiently prevented.

Further, the cleaning work can be reliably carried out even with an apparatus in which the output of the ultraviolet laser beam is not high enough to clean the printed wiring board simultaneously from above and below. This embodiment is advantageous in situations where the printed wiring board 301 must be returned to the process start position for reasons of cleaning process. Furthermore, the apparatus of this embodiment can be installed in a smaller space because various parts need not be arranged above the wiring board, and the cost is low.

Figure 35:
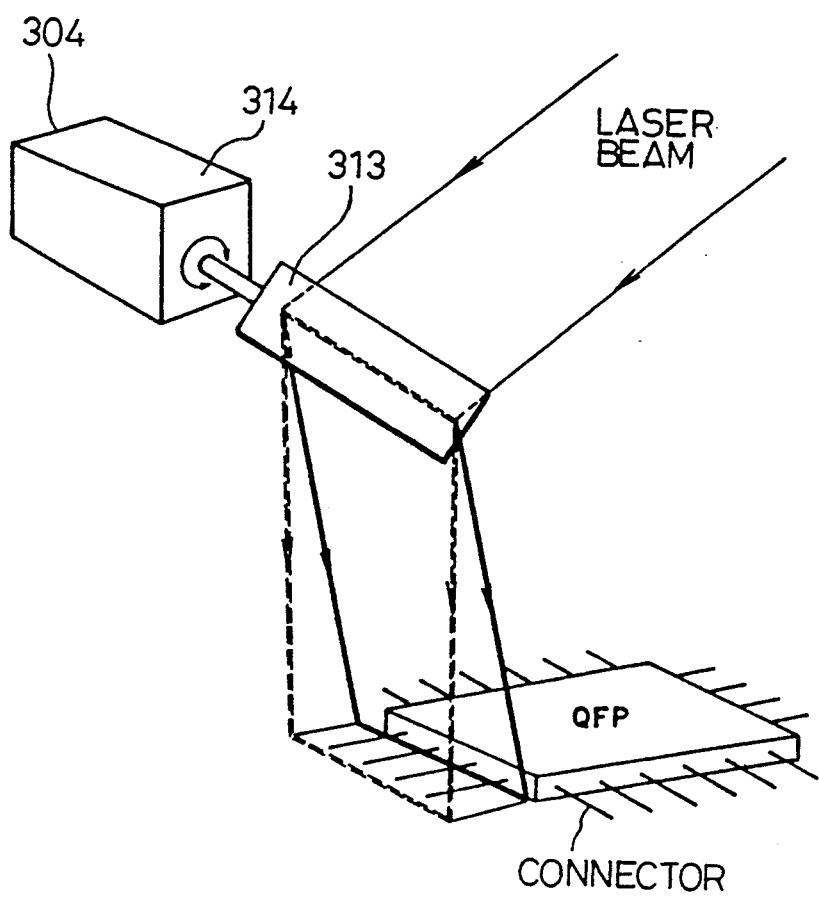
FIG. 35 is a view illustrating an example of using a galvanometer-mirror.

In the cleaning apparatuses 310, 310A and 310B described above, a galvanometer-mirror 304 may be arranged in the path of the strip-shaped ultraviolet laser beam transmitted from the cylindrical lens, as shown in FIG. 35.

The galvanometer-mirror 304 comprises a mirror 313 and a mirror angle adjuster 314, and changes the reflecting angle thereof while reflecting the laser beam emitted from the ultraviolet laser beam radiation apparatus 303. The mirror 313 totally reflects the ultraviolet laser beam, and the mirror angle adjuster 314 adjusts the angle of the mirror 313 with respect to the ultraviolet laser beam in accordance with a control signal.

With the galvanometer-mirror 304, the strip-shaped ultraviolet laser beam transmitted from the cylindrical lens is totally reflected by the mirror 313 toward, e.g., QFP connectors or the like on the printed wiring board 301, as shown in FIG. 35.

The totally reflected ultraviolet laser beam dry-cleans the printed wiring board 301. In this case, the mirror angle adjuster 314 changes the angle of the mirror 313 in accordance with the control signal, and thus the laser beam irradiation spot shifts on the printed wiring board 301. Consequently, the ultraviolet laser beam can be irradiated only to the required portion of the printed wiring board 301.

Thus, the galvanometer-mirror 304 for reflecting the ultraviolet laser beam at a variable reflecting angle is provided across the path of laser radiation from the ultraviolet laser beam radiation apparatus 303. Accordingly, even in the case where QFP connectors are located in a dead zone where the ultraviolet laser beam cannot be irradiated directly by the cylindrical lens, due to limited angular range of ultraviolet laser irradiation, the connectors can be irradiated at a proper angle by using the galvanometer-mirror. Consequently, printed wiring boards of various shapes can be cleaned.

Furthermore, in the cleaning apparatuses 310, 310A and 310B described above, a plurality of optical systems may be arranged in juxtaposition.

Figure 36:
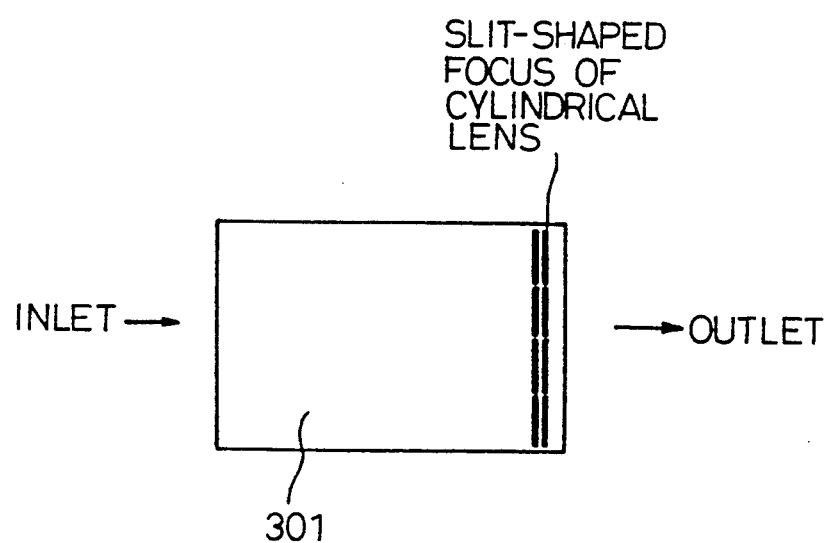
FIG. 36 is a diagram illustrating an operation when a plurality of optical systems are used.
Figure 37:
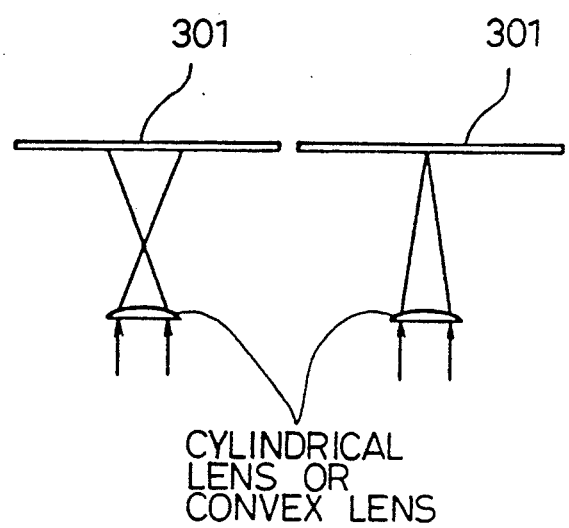
FIG. 37 is a diagram illustrating an operation when a cylindrical or convex lens is defocused.

Use of a plurality of optical systems permits a large-sized printed wiring board 301 or a plurality of printed wiring boards 301 on the XY stage to be cleaned at a time, as shown in FIG. 36 (in the illustrated example, four optical systems are arranged in juxtaposition). In this case, if the output of the ultraviolet laser beam is insufficient, a plurality of ultraviolet laser beam radiation apparatuses 303 may be used.

Furthermore, each of the cylindrical lenses in the cleaning apparatuses 310, 310A and 310B may be replaced with a convex lens. Use of convex lenses facilitates local cleaning.

In the case where the output of the ultraviolet laser beam is sufficiently high, each cylindrical lens or convex lens in the cleaning apparatuses 310, 310A and 310B may be displaced such that the focal point thereof is deviated from the cleaning region of the printed wiring board 301, to thereby enlarge the slit- or spot-shaped cross section of the ultraviolet laser beam for cleaning operation.

By thus enlarging the irradiation range of the ultraviolet laser beam and irradiating the beam onto the printed wiring board 301 obliquely from two directions, a suitable laser output can be obtained even if the output of the ultraviolet laser beam radiation apparatus is too strong. Further, by enlarging the irradiation range of the ultraviolet laser beam to cover the entire printed wiring board 301, the entire area of the wiring board can be dry-cleaned, without the need to move the wiring board 301 by the XY stage.

The apparatuses and methods described above may be suitably combined according to the configuration of the printed wiring board 301, and a conveyor or the like which moves the printed wiring board 301 only in one direction may be used for moving the wiring board 301, instead of the XY stage.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be resorted to, falling within the scope of the invention in the appended claims and their equivalents.

What is claimed is:

1. A method of cutting a pattern formed for wiring on a surface of a printed wiring board with a laser beam whose output is variable, comprising the steps of:
    irradiating the laser beam onto a cutting spot of the pattern to be cut on the printed wiring board, to volatilize and remove the cutting spot; and
    irradiating a laser beam having a lower energy density and a larger irradiation area than that used for cutting the pattern, onto a region of the printed wiring board near the cut spot, to remove molten matter adhering to the region of the printed wiring board near the cut spot.

2. The method according to claim 1, wherein enlarging means is provided for enlarging the irradiation area of the laser beam, said laser beam having a lower energy density and a larger irradiation area than that used for cutting the pattern being obtained by action of said enlarging means with the output of the laser beam maintained at a level identical to that used for cutting the pattern.

3. The method according to claim 1, wherein said laser beam having a lower energy density and a larger irradiation area than that used for cutting the pattern is obtained by setting the output of the laser beam to a level lower than that used for cutting the pattern.

4. The method according to claim 1, wherein said region of the printed wiring board near the cut spot is divided into a plurality of irradiation areas, said laser beam having a lower energy density and an enlarged irradiation area being applied a plurality of times to the respective irradiation areas.

5. A method of cutting an internal-layer pattern formed for wiring in a printed wiring board and covered with resin, by using a laser beam, comprising the steps of:
    irradiating the laser beam onto a region of the resin corresponding in position to a cutting spot of the internal-layer pattern to be cut, to volatilize and remove the region of the resin;
    irradiating the laser beam onto the cutting spot of the internal-layer pattern, to volatilize and remove the cutting spot; and
    irradiating the laser beam onto walls of a recess which is formed due to removal of the resin, to remove molten matter adhering to the walls of the recess.

6. The method according to claim 5, wherein, when removing the molten matter adhering to the walls of the recess, the laser beam is irradiated onto the walls of the recess along the walls in a direction substantially perpendicular to the printed wiring board.

7. The method according to claim 5, wherein, when removing the molten matter adhering to the walls of the recess, the laser beam is irradiated obliquely onto the walls of the recess.

8. The method according to claim 5, wherein the molten matter adhering to the walls of the recess is removed by inclining the printed wiring board, and then irradiating the laser beam onto the walls of the recess.

9. The method according to claim 5, wherein, when removing the molten matter adhering to the walls of the recess, the laser beam is applied a plurality of times to a plurality of different irradiation areas, respectively.

10. The method according to claim 5, wherein, when removing the molten matter adhering to the walls of the recess, the laser beam has an intensity thereof reduced to a level lower than that used for cutting the internal-layer pattern.

11. A method of cutting an internal-layer pattern formed for wiring in a printed wiring board and covered with resin, by using a laser beam, comprising the steps of:
    irradiating the laser beam onto a region of the resin which corresponds in position to a cutting spot of the internal-layer pattern to be cut and to a region around the cutting spot, to expose the internal-layer pattern; and
    irradiating the laser beam onto only the cutting spot of the exposed internal-layer pattern, to cut the internal-layer pattern.

12. The method according to claim 11, wherein, after the internal-layer pattern is cut, the region around the cut spot of the internal-layer pattern is divided into a plurality of portions and the laser beam is irradiated onto each of the divided portions.

13. The method according to claim 11, wherein, after the internal-layer pattern is cut, a laser beam having a lower energy density and a larger irradiation area than that used for cutting the internal-layer pattern is irradiated onto the region around the cut spot of the internal-layer pattern.

14. A method of cutting an internal-layer pattern formed for wiring in a printed wiring board and covered with resin, by using a laser beam, comprising the steps of:
    irradiating the laser beam onto a region of the resin corresponding in position to a cutting spot of the internal-layer pattern to be cut, to volatilize and remove the region of the resin;
    irradiating the laser beam onto the cutting spot of the internal-layer pattern, to volatilize and remove the cutting spot;
    irradiating the laser beam onto another region of the resin which corresponds in position to another spot of the internal-layer pattern close to the cut spot, to volatilize and remove said another region of the resin; and
    irradiating the laser beam onto said another spot of the internal-layer pattern, to volatilize and remove said another spot of the internal-layer pattern.

15. The method according to claim 14, wherein, when removing the respective regions of the resin, the resin is removed for a large area including the cutting spot and said another spot of the internal-layer pattern, respectively.

16. The method according to claim 14, wherein, after the internal-layer pattern is cut, a region around the cut spot of the internal-layer pattern is divided into a plurality of portions and the laser beam is irradiated onto each of the divided portions.

17. The method according to claim 14, wherein, after the internal-layer pattern is cut, a laser beam having a lower energy density and an enlarged irradiation area than that used for cutting the internal-layer pattern is irradiated onto a region around the cut spot of the internal-layer pattern.

18. An apparatus for cutting a wiring pattern of a printed wiring board with a laser beam, comprising:
    a table for carrying the printed wiring board thereon and for moving the printed wiring board;
    a laser oscillator;
    laser beam masking means for adjusting a range of irradiation of a laser beam emitted from the laser oscillator; and laser beam masking control means for controlling the laser beam masking means such that an irradiation area of the laser beam is reduced during a pattern cutting and is enlarged during a removal of molten matter.

19. An apparatus for cutting a wiring pattern of a printed wiring board with a laser beam, comprising:
a table for carrying the printed wiring board thereon and for moving the printed wiring board;
laser beam irradiation means for irradiating a laser beam onto a cutting spot of the wiring pattern of the printed wiring board on the table; and
table control means for controlling the position of the table with respect to the direction of the laser beam such that an irradiation area of the laser beam is reduced during a pattern cutting and is enlarged during a removal of molten matter.

20. An apparatus for cutting a wiring pattern of a printed wiring board with a laser beam, comprising:
a table for carrying the printed wiring board thereon and for moving the printed wiring board;
laser oscillator means;
light converging means for converging a laser beam from the laser oscillator means to fall upon the printed wiring board placed on the table; and
convergence control means for controlling the light converging means such that an irradiation area of the laser beam is reduced during a pattern cutting and is enlarged during a removal of molten matter.

21. An apparatus for cutting a wiring pattern of a printed wiring board with a laser beam, comprising:
a table for carrying the printed wiring board thereon and for moving the printed wiring board;
a laser oscillator whose output is adjustable;
laser beam irradiation means for irradiating a laser beam from the laser oscillator onto a cutting spot of the wiring pattern of the printed wiring board on the table; and
laser oscillator control means for controlling the output of the laser oscillator such that the output is high during a pattern cutting and is low during a removal of molten matter.

22. A method of cutting a wiring pattern of a printed wiring board by evaporating the wiring pattern, in which the wiring pattern is intermittently irradiated with a pulsed laser beam from a laser apparatus, and in which a suction nozzle including a rotary flat brush and suction means is provided, the method comprising the steps of:
adjusting the width of the laser beam from the laser apparatus to be identical to the width of the wiring pattern to be cut;
irradiating the laser beam onto a cutting spot of the wiring pattern of the printed wiring board; and
removing particles scattered by the laser beam irradiation from the printed wiring board by using the rotary flat brush of the suction nozzle, and sucking up the particles by the suction means.

23. A method of cutting a wiring pattern of a printed wiring board by evaporating the wiring pattern, in which the wiring pattern is irradiated with a laser beam emitted from a laser apparatus, and in which a tape feeding apparatus is provided which includes a press roller for pressing an incombustible sheet or tape against the printed wiring board and a take-up roller for winding the sheet or tape thereon, the method comprising the steps of:
applying the laser beam from the laser apparatus to a cutting spot of the wiring pattern of the printed wiring board from above the sheet or tape;
receiving particles scattered by the laser beam irradiation on the sheet or tape; and
winding the sheet or tape around the take-up roller after the laser beam irradiation.

24. An apparatus for cutting a wiring pattern of a printed wiring board by irradiating a laser beam onto the wiring pattern to evaporate same, comprising:
a laser apparatus for intermittently emitting a pulsed laser beam whose pulse width, pulse height, irradiation interval and number of times of irradiations are variable, the laser apparatus including a mask arranged midway in a path of the laser beam for adjusting the width of the laser beam to be identical to the width of the wiring pattern to be cut;
a suction nozzle including a rotary flat brush and connected to an exhaust system, the rotary flat brush being rotated and moved along an axis of rotation thereof by a drive unit to sweep a surface region including a cut spot of the printed wiring board and including a vent hole; and
a carrier mechanism including an XY table carrying the printed wiring board thereon and movable to a desired position on a plane, and a control unit for numerically controlling the movement of the XY table.

25. An apparatus for cutting a wiring pattern of a printed wiring board by irradiating a laser beam onto the wiring pattern to evaporate same, comprising:
a laser apparatus for intermittently emitting a pulsed laser beam whose pulse width, pulse height. irradiation interval and number of times of irradiations are variable, the laser apparatus including a mask arranged midway in a path of the laser beam for adjusting the width of the laser beam to be identical to the width of the wiring pattern to be cut;
a carrier mechanism including an XY table carrying the printed wiring board thereon and movable to a desired position on a plane, and a control unit for numerically controlling the movement of the XY table; and
a tape feeding apparatus including a press roller for pressing an incombustible sheet or tape into close contact with a cutting spot of the wiring pattern of the printed wiring board, and a take-up roller for winding the sheet or tape thereon after the wiring pattern is cut by irradiation of the laser beam from above the sheet or tape, in such a manner that a surface of the sheet or tape to which particles scattered during cutting of the wiring pattern adhere is wound inside.

26. A method of cutting an internal-layer pattern of a printed wiring board by irradiating a laser beam whose width is adjustable, the internal-layer pattern being located below a resin layer of the printed wiring board, the method comprising the steps of:
applying the laser beam to the resin layer on the internal-layer pattern;
detecting a first change at the laser beam-irradiated portion from resin forming the resin layer to metal forming the internal-layer pattern;
stopping the irradiation of the laser beam when the first change is detected;
determining a width of the internal-layer pattern which is exposed due to removal of the resin layer;

irradiating a laser beam, whose width is adjusted in accordance with the determined width of the internal-layer pattern, onto the internal-layer pattern;

detecting a second change at the laser beam-irradiated portion from metal forming the internal-layer pattern and resin forming the resin layer; and stopping the irradiation of the laser beam when the second change is detected.

27. The method according to claim 26, wherein a camera is provided for acquiring an image of the laser beam-irradiated portion, said first and second changes being each detected by acquiring an image of the laser beam-irradiated portion with the camera and subjecting the acquired image to image processing.

28. The method according to claim 26, wherein said first and second changes are each determined by detecting a change of light spectrum at the laser beam-irradiated portion.

29. The method according to claim 26, wherein said first and second changes are each determined by detecting a change of acoustic spectrum at the laser beam-irradiated portion.

30. The method according to claim 26, wherein said second change is determined by detecting a change of electrical resistance of the internal-layer pattern.

31. The method according to claim 26, wherein a metal mask is arranged across a path of the laser beam, a mask width of the metal mask being adjusted in accordance with the determined width of the internal-layer pattern.

32. An apparatus for cutting an internal-layer pattern formed in a printed wiring board below a resin layer, comprising:

laser oscillator means for emitting a laser beam to remove the resin layer on the internal-layer pattern and to cut the internal-layer pattern;

imaging means for acquiring an image of a portion irradiated with the laser beam;

state detecting means for detecting completion of removal of the resin layer on the internal-layer pattern and completion of cutting of the internal-layer pattern, based on information provided by the imaging means;

determining means for determining a width of the internal-layer pattern, based on the information from the imaging means; and laser beam adjusting means for adjusting the width of the laser beam in accordance with the determined width of the internal-layer pattern.

* * * * *